United States Patent
Seol et al.

(10) Patent No.: US 8,379,441 B2
(45) Date of Patent: Feb. 19, 2013

(54) VARIABLE RESISTANCE MEMORY AND MEMORY SYSTEM INCLUDING THE SAME

(75) Inventors: Kwang Soo Seol, Yongin-si (KR); Yoondong Park, Yongin-si (KR); Deok-kee Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 265 days.

(21) Appl. No.: 12/854,540

(22) Filed: Aug. 11, 2010

(65) Prior Publication Data

US 2011/0038197 A1    Feb. 17, 2011

(30) Foreign Application Priority Data

Aug. 11, 2009   (KR) .................. 10-2009-0073908

(51) Int. Cl.
*G11C 11/00* (2006.01)
(52) U.S. Cl. ........................ 365/163; 365/113
(58) Field of Classification Search .................. 365/163, 365/113
See application file for complete search history.

(56) References Cited

U.S. PATENT DOCUMENTS

| 7,002,837 | B2 | 2/2006 | Morimoto |
| 7,535,035 | B2 | 5/2009 | Baek et al. |
| 2009/0027955 | A1 | 1/2009 | Koh et al. |
| 2009/0285015 | A1* | 11/2009 | Ha et al. .......................... 365/163 |
| 2009/0316474 | A1* | 12/2009 | Cho et al. ....................... 365/163 |

FOREIGN PATENT DOCUMENTS

| JP | 2004-272975 A | 9/2004 |
| JP | 2006-140464 A | 6/2006 |
| JP | 2009-033177 A | 2/2009 |
| KR | 10-2009-0011452 A | 0/2200 |
| KR | 10-2004-0079328 A | 9/2004 |
| KR | 10-2006-0046809 A | 5/2006 |

* cited by examiner

*Primary Examiner* — Jason Lappas
(74) *Attorney, Agent, or Firm* — Lee & Morse, P.C.

(57) ABSTRACT

A variable resistance memory array includes at least one variable resistance memory cell, wherein each variable resistance memory cell includes a well having a first type; and a cell structure on the well, the cell structure including a structure having a second type different from the first type and a variable resistance layer on the structure.

18 Claims, 18 Drawing Sheets

VARIABLE RESISTANCE MEMORY AND MEMORY SYSTEM INCLUDING THE SAME

BACKGROUND

Embodiments herein relate to a variable resistance memory, and more particularly, to a variable resistance memory and a memory system including the same.

A semiconductor memory device is a memory device realized using a semiconductor, e.g., Si (silicon), Ge (Germanium), GaAs (gallium arsenide), and InP (indium phosphide). Semiconductor memory devices are typically classified as volatile memory devices or nonvolatile memory devices.

Volatile memory devices lose stored data when a power supply is cut off. Volatile memory devices include static RAM (SRAM), Dynamic RAM (DRAM), and synchronous DRAM (SDRAM). Nonvolatile memory devices retain stored data even when power supply is cut off Nonvolatile memory devices include Read Only Memory (ROM), Programmable ROM (PROM), Electrically Programmable ROM (EPROM), Electrically Erasable and Programmable ROM (EEPROM), Flash memory device, Phase-change RAM (PRAM), Magnetic RAM (MRAM), Resistive RAM (RRAM), Ferroelectric RAM (FRAM). Flash memory devices are typically classified as a NOR type or a NAND type.

SUMMARY

Embodiments are therefore directed to a variable resistance memory and a memory system including the same, which substantially overcome one or more of the problems due to the limitations and disadvantages of the related art.

It is therefore a feature of an embodiment to provide a variable resistance memory and a memory system including the same having improved reliability.

It is another feature of an embodiment to provide a variable resistance memory and a memory system including having improved operational characteristic.

At least one of the above and other features and advantages may be realized by providing variable resistance memory arrays that including at least one variable resistance memory cell, wherein each variable resistance memory cell including a well having a first type; and a cell structure on the well, the cell structure including a structure having a second type different from the first type and a variable resistance layer on the structure.

In some embodiments, the variable resistance memory arrays may further include a switch device for controlling an amount of current flowing between the well and a conductive line.

In other embodiments, an amount of current flowing through the switch device may be less than an amount of current changing a state of the variable resistance layer.

In still other embodiments, the current changing a state of the variable resistance layer may be provided to the variable resistance layer by bypassing the switch device.

In even other embodiments, each variable resistemce memory cell may further includes a second well having the second type, the second well being provided below the well.

In yet other embodiments, the structure, the well, and the second well may operate as a transistor.

In further embodiments, the second well may extend in a first direction and a second direction to form a memory block.

In still further embodiments, at least two variable resistance memory cells may share the second well.

In even still further embodiments, the well may be extended in a second direction, and at least two variable resistance memory cells may share the extended well.

In even still further embodiments, a conductor may be provided on the cell structure, the conductor may be extended in a second direction, and at least two variable resistance memory cells may share the extended conductor.

In even still further embodiments, the well may be connected to a bit line through a switch.

In even still further embodiments, the well having the first type and the structure having the second type may operate as a diode.

In even further embodiments, the well may provide a channel between cells arranged in a second direction among the at least one the variable resistance memory cell.

At least one of the above and other features and advantages may be realized by providing variable resistance memory devices that include a memory array including at least one variable resistance memory cell; a word line driver biasing at least one word line connected to the at least one variable resistance memory cell; and a bit line driver and sense circuit biasing at least one bit line connected to the at least one variable resistance memory cell and sensing a voltage of the at least one bit line, wherein each variable resistance memory cell includes: a well having a first type; and a cell structure on the well, the cell structure including a structure having a second type different from the first type and a variable resistance layer on the structure.

In some embodiments, the well is extended in a second direction, and at least two variable resistance memory cells share the extended well.

In other embodiments, a second well is provided below the well, and at least two variable resistance memory cells are provided on the second well.

In still other embodiments, the second well is floated during an program or read operation of the at least two variable resistance memory cells.

In even other embodiments, the second well is biased with a voltage lower than a ground voltage during an erase operation of the at least two variable resistance memory cells.

At least one of the above and other features and advantages may be realized by providing memory systems that include a variable resistance memory device; and a controller configured to control the variable resistance memory device, wherein the variable resistance memory device includes a memory array including at least one variable resistance memory cell; a word line driver biasing at least one word line connected to the at least one variable resistance memory cell; and a bit line driver and sense circuit biasing bit lines connected to the at least one variable resistance memory cell through at least one bit line and sensing a voltage of the at least one bit line, wherein each variable resistance memory cell includes: a well having a first type; a second well having a second type different from the first type provided below the well; and a cell structure on the well, the cell structure including a structure having the second type and a variable resistance layer on the structure.

In some embodiments, the variable resistance memory device and the controller forms a solid state drive (SSD).

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
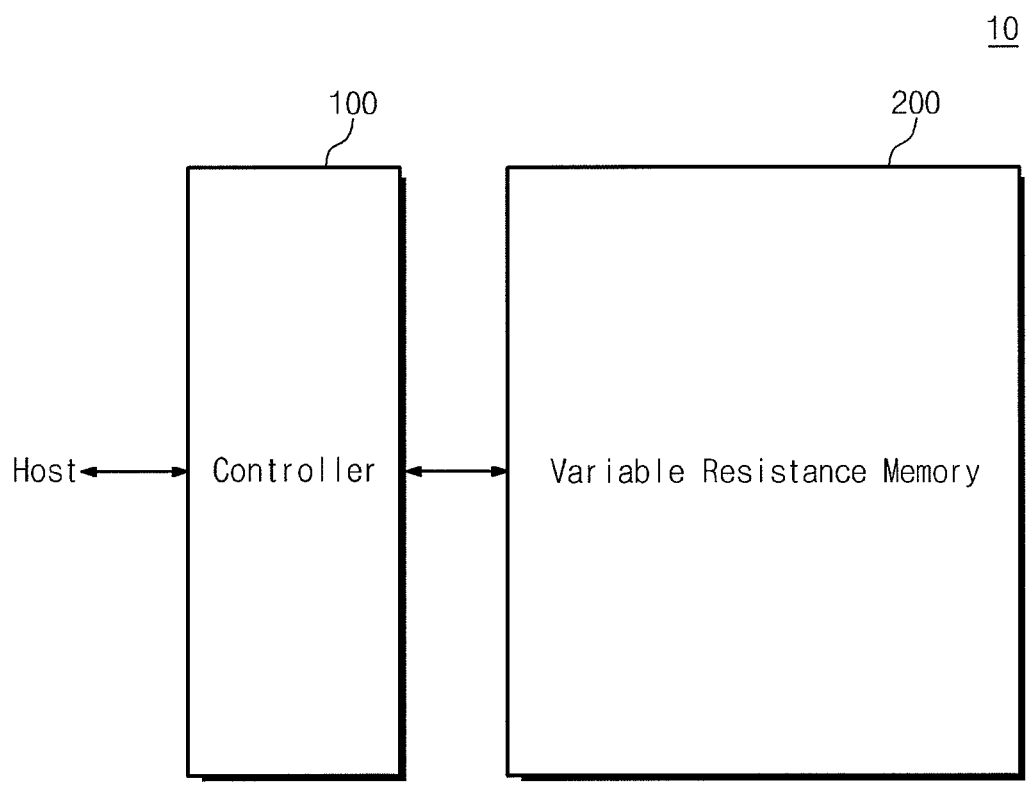
FIG. 1 illustrates a block diagram of a memory system according to an embodiment.

Korean Patent Application No. 10-2009-0073908, filed on Aug. 11, 2009, in the Korean Intellectual Property Office, and entitled: "Variable Resistance Memory and Memory System Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. Like reference numerals denote like elements.

FIG. 1 illustrates a block diagram of a memory system 10 according to an embodiment. Referring to FIG. 1, the memory system 10 includes a controller 100 and a variable resistance memory device 200.

The controller 100 may be connected to a host and the variable resistance memory device 200. In response to a request from the host, the controller 100 is configured to access the variable resistance memory device 200. For example, the controller 100 is configured to control read, write, and erase operations of the variable resistance memory device 200. The controller 100 is configured to provide an interface between the host and the variable resistance memory device 200. The controller 100 is configured to drive a firmware to control the variable resistance memory device 200.

The controller 100 may include typical components, e.g., a Random Access Memory (RAM), a processing unit, a host interface, a memory interface, and so forth. The RAM is used as an operating memory of a processing unit. The processing unit controls general operations of the controller 100.

The host interface includes a protocol for exchanging data between the host and the controller 100. For example, the controller 100 may be configured to use one of various interface protocols to communicate with the external (e.g., a host). Examples of various interface protocols include a Universal Serial Bus (USB) protocol, a multimedia card (MMC) protocol, a peripheral component interconnection (PCI) protocol, a PCI-express (PCI-E) protocol, an Advanced Technology Attachment (ATA) protocol, a Serial-ATA protocol, a Parallel-ATA protocol, a small computer small interface (SCSI) protocol, an enhanced small disk interface (ESDI) protocol, and an Integrated Drive Electronics (IDE) protocol. The memory interface interfaces with the variable resistance memory device 200.

The memory system 10 may additionally include an error connection block. The error correction block detects and corrects errors of data read from the variable resistance memory device 200. The error correction block may be provided as a component of the controller 100 and/or the variable resistance memory device 200.

The controller 100 and the variable resistance memory device 200 may be integrated into one semiconductor device. For example, the controller 100 and the variable resistance memory device 200 may be integrated into one semiconductor device to constitute a memory card. For another example, the controller 100 and the variable resistance memory device 200 may be integrated into one semiconductor device to constitute, e.g., a personal computer memory card international association (PCMCIA), a Smart Media Card (SM, SMC), a memory stick, a Multi Media Card (MMC, RS-MMC, MMC-micro), a SD card (SD, miniSD, microSD, SDHC), and so forth.

For another example, the controller 100 and the variable resistance memory device 200 are integrated into one semiconductor device to constitute a semiconductor drive (e.g., Solid State Drive (SSD)). For example the semiconductor drive (e.g., SSD) includes a storage device for storing data in a semiconductor memory. If the memory system 10 is used as the semiconductor drive SSD, an operating speed of the host connected to the memory system 10 will be drastically improved.

For another example, the memory system 100 is applied to a computer, a mobile computer, a Ultra Mobile PC (UMPC), a workstation, a net-book, a PDA, a portable computer, a web tablet, a wireless phone, a mobile phone, a smart phone, a digital camera, a digital audio recorder, a digital audio player, a digital picture recorder, a digital picture player, a digital video recorder, a digital video player, a device for transmitting and receiving information via a wireless environment, one of various electronic devices constituting a home network, one of various electronic devices constituting a computer network, one of various electronic devices constituting a telematics network, an RFID device, or one of various components (e.g., a semiconductor drive (e.g., SSD), a memory card, etc.) constituting a computing system.

For another example, the variable resistance memory device 200 or the memory system 100 are mounted using various types of packages. For example, the variable resistance memory device 200 or the memory system 100 is mounted through the various packages including Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

Figure 2:
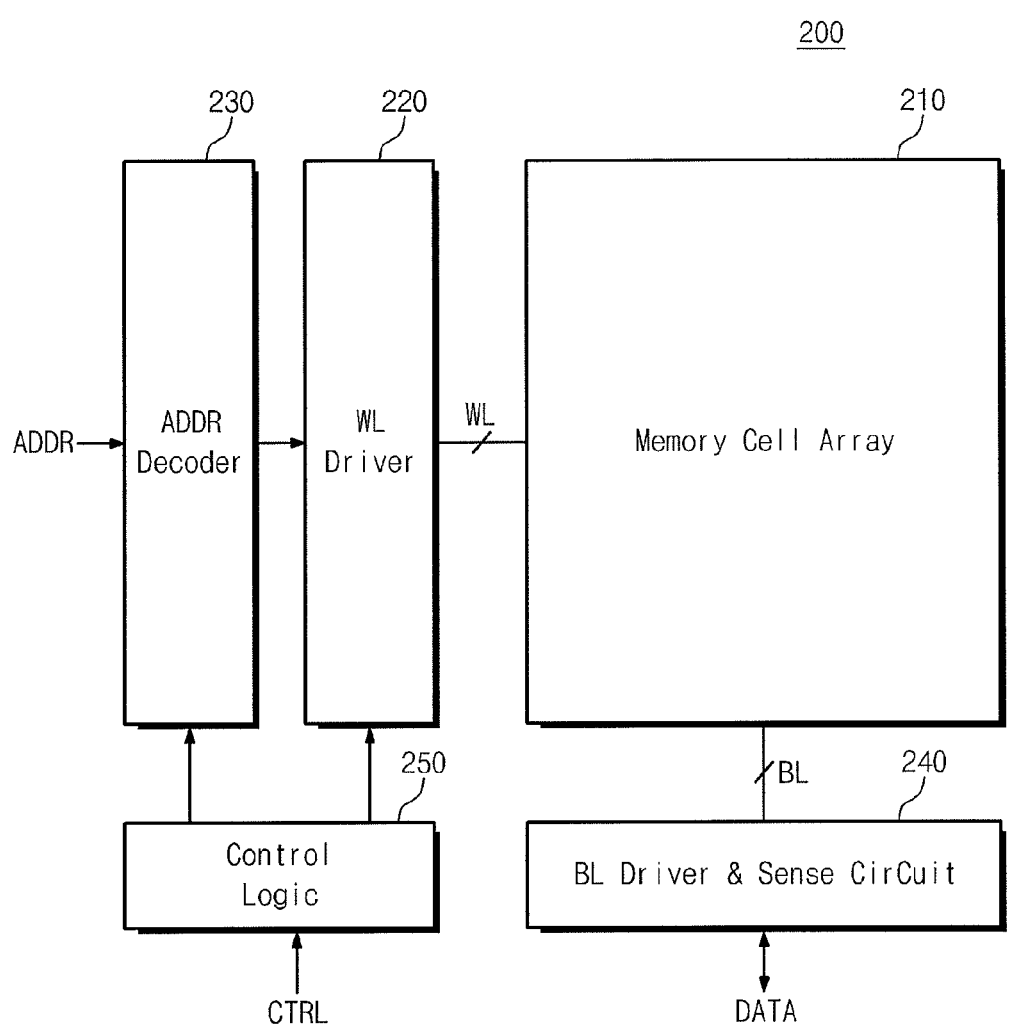
FIG. 2 illustrates a block diagram of the variable resistance memory device of FIG. 1.

FIG. 2 illustrates a block diagram of the variable resistance memory device 200 of FIG. 1. Referring to FIG. 2, the variable resistance memory device 20 includes a memory cell array 210, a word line driver 220, an address decoder 230, a bit line driver and sense circuit 240, and a control logic 250.

The memory cell array 210 is connected to the word line driver 220 through the word lines WL, and connected to the bit line driver and sense circuit 240 through the bit lines BL. The memory cell array 210 includes a plurality of memory cells. For example, memory cells arranged in a row direction are connected to the word lines WL. For example, memory cells arranged in a column direction are connected to the bit lines BL. For example, the memory cell array 210 is configured to store at least one bit in one cell. The memory cell array 210 will be described in more detail with reference to FIG. 3.

The word line driver 220 is connected to the memory cell array 210, the address decoder 230, and the control logic 250. The word line driver 220 operates in response to a control of the control logic 250. The word line driver 220 receives a decoded row address from the address decoder 230. Based on the decoded row address, the word line driver 220 is configured to bias the word lines WL. For example, the word line driver 220 is configured to provide a voltage or a current to the word lines WL.

The address decoder 230 is connected to the word line driver 220 and the control logic 250. The address decoder 230 operates in response to a control of the control logic 250. The address decoder 230 receives an address ADDR from the external. For example, the address ADDR is provided from the controller 100 of FIG. 1. The address decoder 230 decodes the received address ADDR.

For example, the address decoder 230 decodes a row address and generates the decoded row address. The decoded row address is provided to the word line driver 220. The address decoder 230 decodes a column address and generates the decoded column address. The decoded column address is provided to the bit line driver and sense circuit 240. The address decoder 230 includes typical components, e.g., an address buffer, a column address decoder, a row address decoder, and so forth.

The bit line driver and sense circuit 240 is connected to the memory cell array 210 and the control logic 250. The bit line driver and sense circuit 240 operates in response to a control of the control logic 250. The bit line driver and sense circuit 240 is configured to exchange data with the external. For example, the bit line driver and sense circuit 240 is configured to exchange data with the controller 100 of FIG. 1.

The bit line driver and sense circuit 240 receives the decoded column address from the address decoder 230. In response to the decoded column address, the bit line driver and sense circuit 240 is configured to select the bit lines BL. For example, in response to the decoded column address and data, the bit line driver and sense circuit 240 is configured to bias the bit lines BL.

The bit line driver and sense circuit 240 is configured to sense a voltage level of the bit lines BL. The bit line driver and sense circuit 240 is configured to sense the data stored in the selected memory cells by sensing a voltage level of the bit lines BL.

The control logic 250 is connected to the word line driver 220, the address decoder 230, and the bit line driver and sense circuit 240. The control logic 250 is configured to control general operations of the variable resistance memory device 200. For example, the control logic 250 controls the word line driver 220 and the bit line driver and sense circuit 240 to write data in the memory cell array 210. The control logic 250 controls the word line driver 220 and the bit line driver and sense circuit 240 to read data from the memory cell array 210.

For example, the control logic 250 operates in response to a control signal CTRL received from the external. For example, the control signal CTRL is provided from the controller 100 of FIG. 1.

Figure 3:
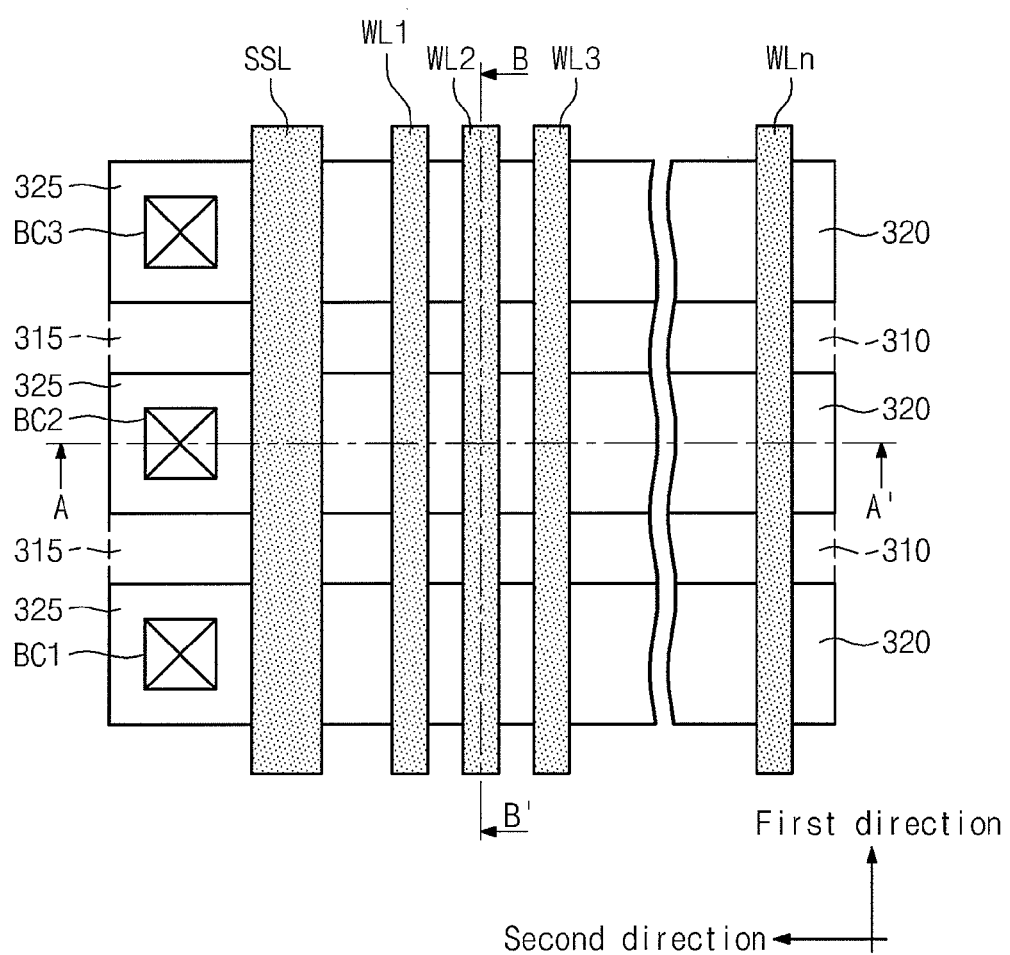
FIG. 3 illustrates a partial plan view of the memory cell array of FIG. 2.
Figure 4:
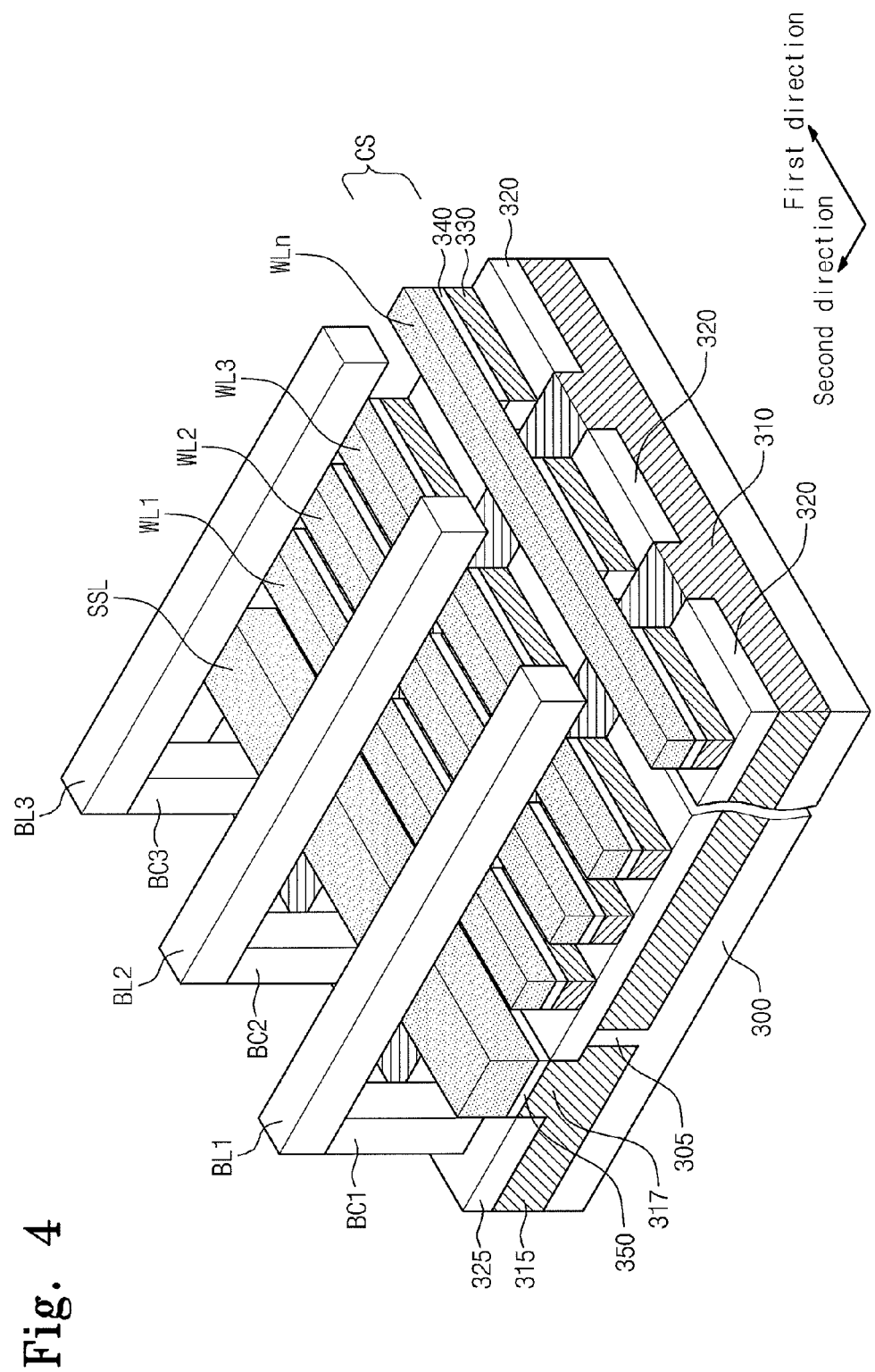
FIG. 4 illustrates a partial perspective view of the memory cell array of FIG. 2.
Figure 5:
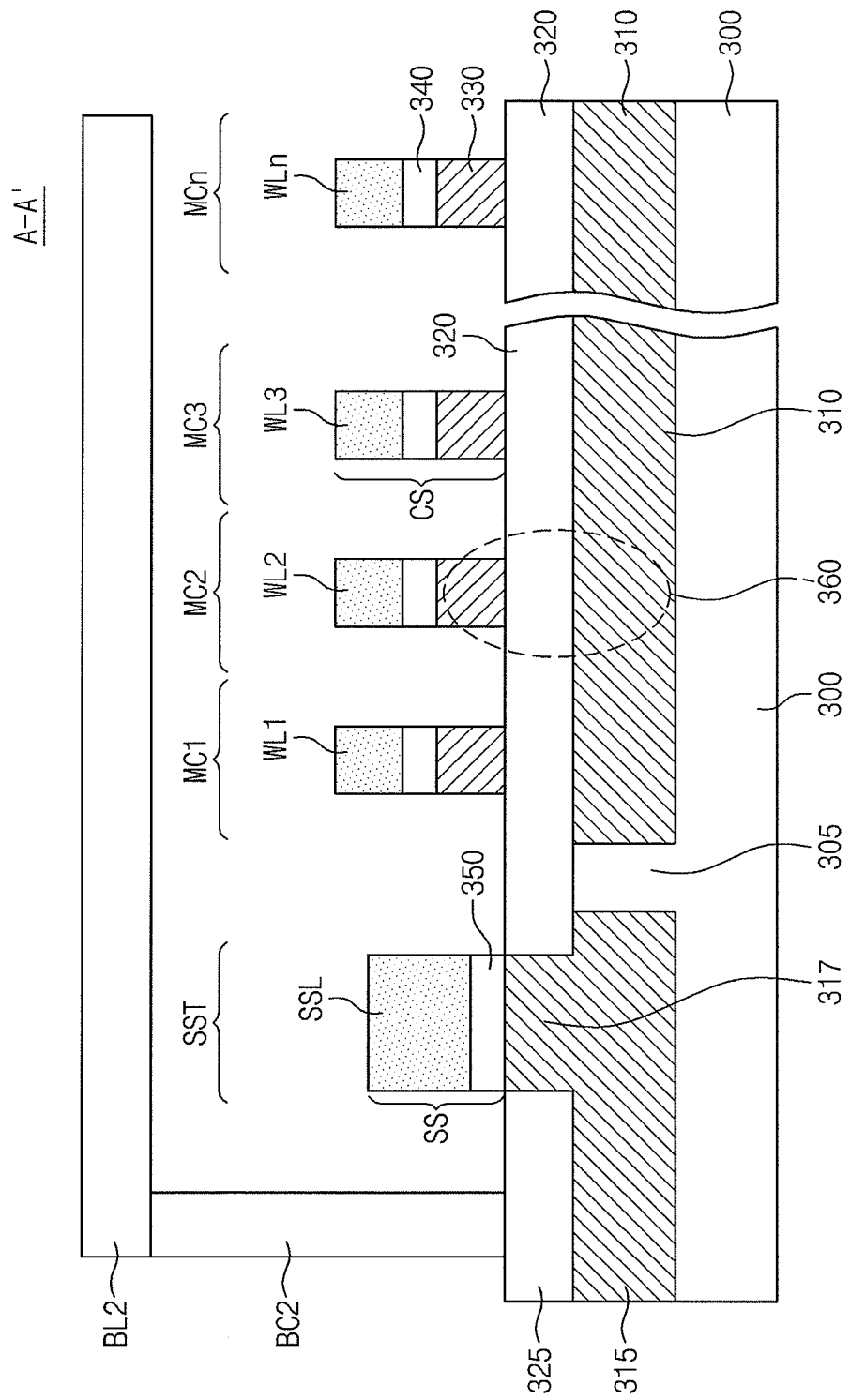
FIG. 5 illustrates a sectional view taken along the line A-A' of FIG. 3.
Figure 6:
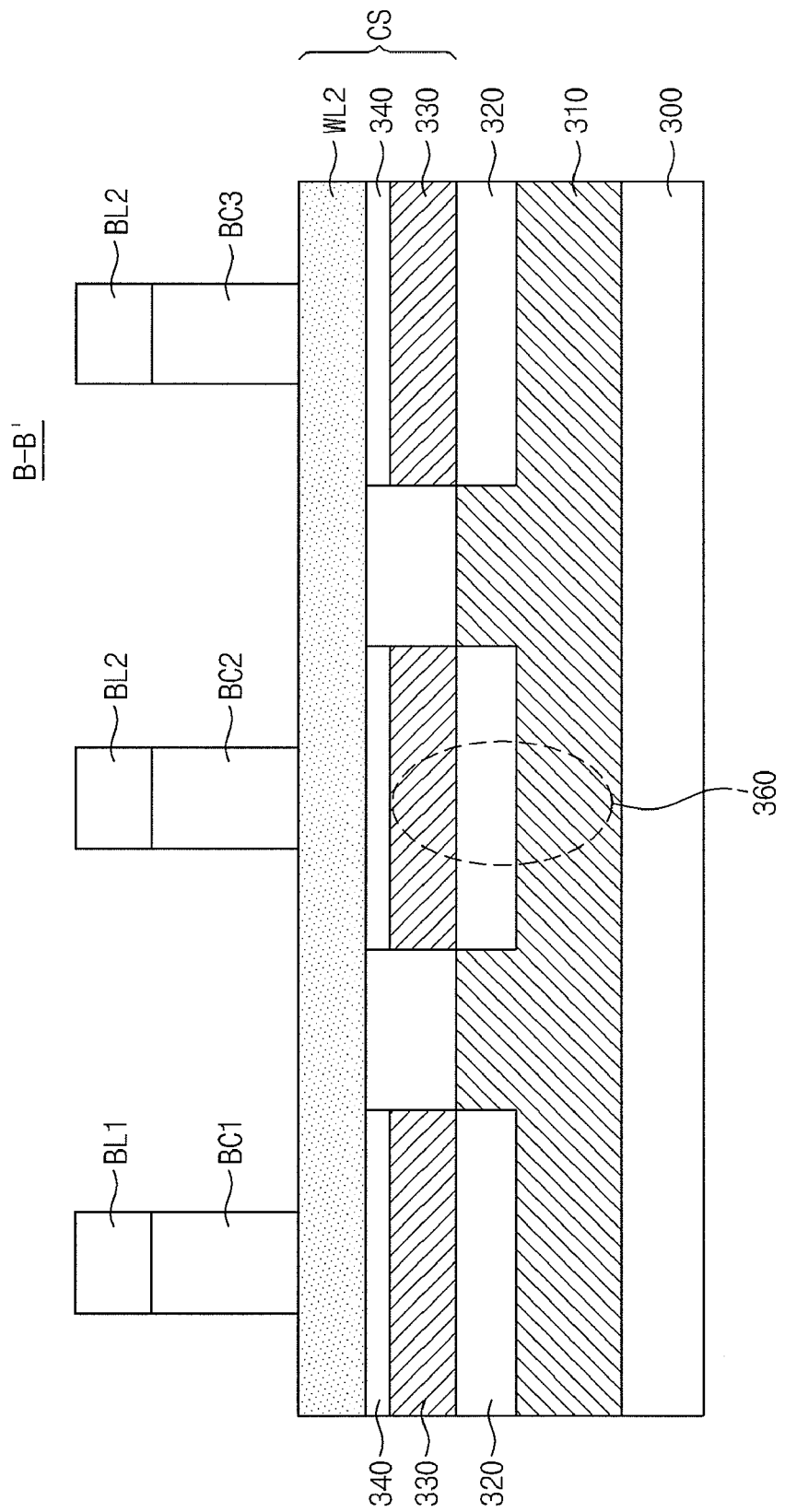
FIG. 6 illustrates a sectional view taken along the line B-B' of FIG. 3.

FIG. 3 illustrates a partial plan view of the memory cell array 210 of FIG. 2. FIG. 4 illustrates a partial perspective view of the memory cell array 210 of FIG. 2. FIG. 5 illustrates a sectional view taken along the line A-A' of FIG. 3. FIG. 6 illustrates a sectional view taken along the line B-B' of FIG. 3. In FIGS. 3 to 6, three bit lines BL1 to BL3 are illustrated. However, it should be understood that the number of bit lines in the memory cell array 210 is not restricted.

Referring to FIGS. 3 to 6, first type wells 310 and 315 are provided on a bulk region 300. For example, the first type wells 310 and 315 may be p-type wells. The first type wells 310 and 315 are separated by a first separation region 305. The first separation region 305 extends in a first direction. The first separation region 305 may be formed of the same material as the bulk region 300. That is, the first type wells 310 and 315 are formed on a region except for the first separation region 305.

Second type wells 320 and 325 are provided on the first type wells 310 and 315 and the first separation region 305. For example, the second type wells 320 and 325 may be n-type wells. The second type wells 320 and 325 are formed with a predetermined interval along the first direction. The second type wells 320 and 325 are separated by a second separation region 317. The second separation region 317 extends in the first direction. The second separation region 317 may be formed of the same material as the first type wells 310 and 315. That is, the second type wells 320 and 325 are formed on the first type wells 310 and 315 and the first separation region 317, on a region except for the second separation region 317, and with a predetermined interval along the first direction.

Cell structures CS are formed on the second type wells 320. Bit line contacts BC1-BC3 are formed on the second type wells 325. Additionally, a switch structure SS may be formed on the second separation region 317.

Each cell structure CS includes a first type structure 330, a variable resistance layer 340, and a conductor. The first type structures 330 may be formed on the second type wells 320. For example, the first type structures 330 may be p-type wells. For example, the first type structures 330 may be formed of p-type silicon. The first type structures 330 are formed on the second type wells 320 with a predetermined interval along the second direction.

The variable resistance layer 340 is formed on the first type structure 330. The variable resistance layer 340 may be formed of a material having a different resistance value according to a bias condition of a voltage or a current. For example, the variable resistance layer 340 may be formed of one of titanium oxide (TiOx), tungsten oxide (WOx), copper silicon dioxide ($Cu:SiO_2$), silver germanium sulfide (Ag:

GeS), silver germanium selenide (Ag:GeSe), nickel oxide (NiOx), and aluminum oxide (AlOx).

The conductor is formed on the variable resistance layer 340. The conductors extend in the first direction without disconnection, i.e., continuously. That is, the conductors extend in the first direction to form the word lines WL1 to WLn. The word lines WL1 to WLn are connected to the word line driver 220 of FIG. 2. For example, the conductor is formed of a conductive material, e.g., poly-silicon or a metal material, e.g., Pt, W, and ((Fe, Mn)(Ta, Nb)xOy).

The first type structures 330, the second type wells 320, and the first type well 310 constitute selection devices 360. For example, each selection device 360 may include the first type structure 330, a region corresponding to the first type structure 330 in the second type wells 320, and a region corresponding to the first type structure 330 in the first type well 310. That is, the same number of selection devices 360 as the number of cell structures CS is provided. One selection device 360 and the corresponding variable resistance layer 340 constitute a memory cell. That is, the same number of memory cells as the number of cell structures CS is provided. Operations of the selection devices 360 and the memory cells MC1 to MCn are described in more detail with reference to FIGS. 9 to 14.

A switch structure SS includes an insulation layer 350 and a conductor. The insulation layer 350 is formed on the second separation region 317. For example, the insulation layer 350 is formed an insulation material, e.g., silicon oxide, silicon nitride, and so forth. Conductors are formed on the insulation layers 350. The conductors extend in the first direction to form a string selection line SSL. For example, the conductors are formed of a conductive material, e.g., poly-silicon or a metal material, e.g., Pt, W, and ((Fe, Mn)(Ta, Nb)xOy).

The string selection line SSL, the insulation layer 350, the first type well 315, and the second type wells 320 and 325 constitute a switch. For example, the string selection line SSL, the insulation layer 350, the first type well 315, and the second type wells 320 and 325 constitute a field effect transistor (FET). The first type well 315 operates as a body, the second type wells 320 and 325 operate as a source and a drain, and the string selection line SSL operates as a gate. Hereinafter, a transistor including the string selection line SSL, the insulation layer 350, the first type well 315, and the second type wells 320 and 325 is defined as a string selection transistor SST.

The bit line contacts BC1 to BC3 are connected to the bit lines BL1 to BL3, respectively. The bit lines BL1 to BL3 extend in the second direction. The bit lines BL1 to BL3 are connected to the bit line driver and sense circuit 240 of FIG. 2. For example, the bit line contacts BC1 to BC3 and the bit lines BL1 to BL3 are formed of a conductive material, e.g., poly-silicon or a metal material, e.g., Pt, W, and ((Fe, Mn)(Ta, Nb)xOy).

As shown in FIGS. 3 to 6, the second type well 320 is configured to serve as a channel (or a signal path) between the memory cells MC1 to MCn. The memory cells MC1 to MCn form a string structure connected to the second type wells 320. The string selection transistor SST operates as a switch for electrically connecting and separating the second type wells 320 and 325. That is, the string selection transistor SST selects strings of the memory cells MC1 to MCn.

Figure 7:
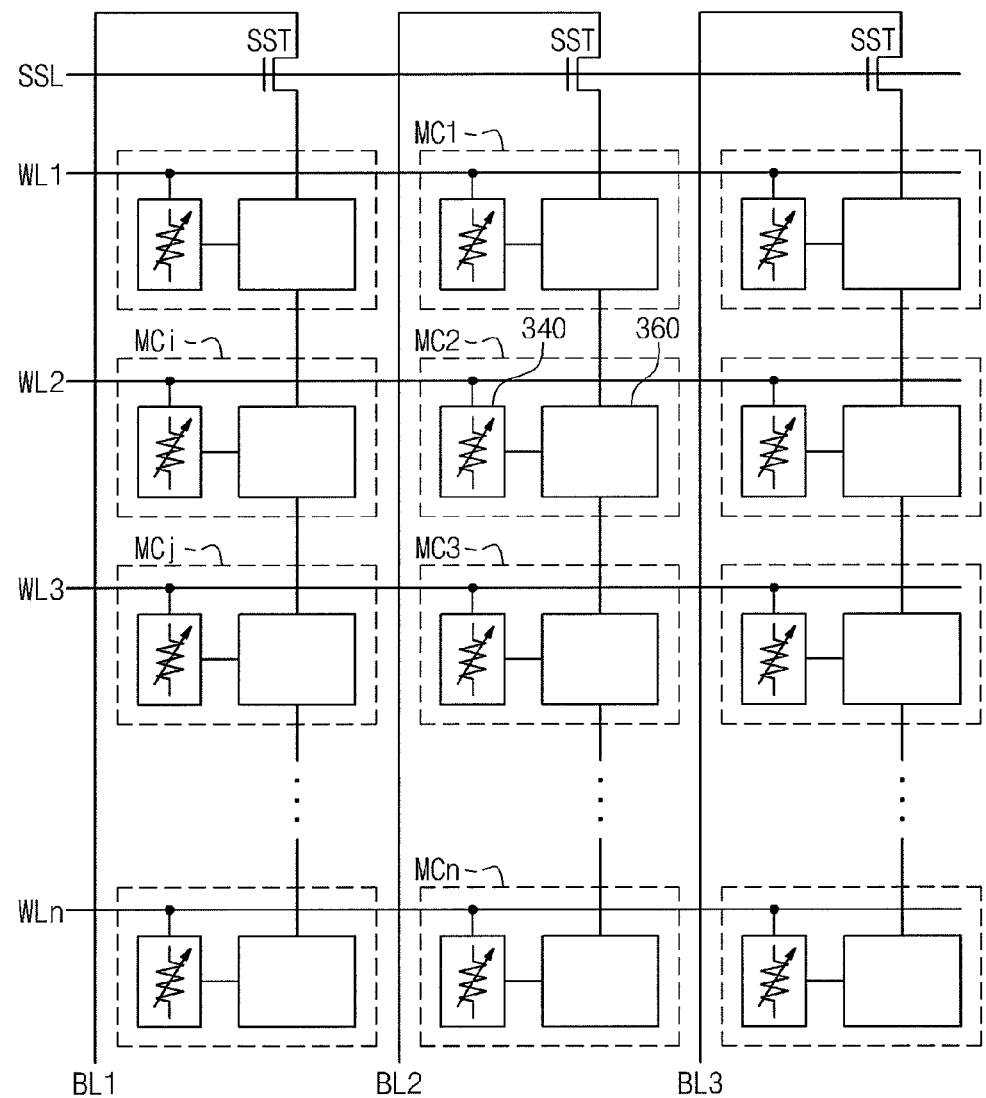
FIG. 7 illustrates a partial circuit diagram of an equivalent circuit of the memory cell array described with reference to FIGS. 3 to 6.

FIG. 7 illustrates a partial circuit diagram of an equivalent circuit of the memory cell array 210 described with reference to FIGS. 3 to 6. Referring to FIG. 7, each memory cell MC1 to MCn and MCi to MCj includes a variable resistance 340 and a selection device 360. The variable resistance 340 corresponds to the variable resistance layer 340 described with reference to FIGS. 3 to 6. Thus, the variable resistance 340 and the variable resistance layer 340 are referred to using the same reference number.

The variable resistances 340 are connected between the word lines WL1 to WLn and the selection devices 360. The selection devices 360 are connected to the bit lines BL1 to BL3 through the string selection transistors SST. For example, selection devices of the memory cells (e.g., MC1 to MCn) corresponding to one string are connected to one bit line (e.g., BL2) through the string selection transistor SST. As described with reference to FIGS. 3 to 6, the string of the memory cells (e.g., MC1 to MCn) is formed by the second type wells 320.

Figure 8:
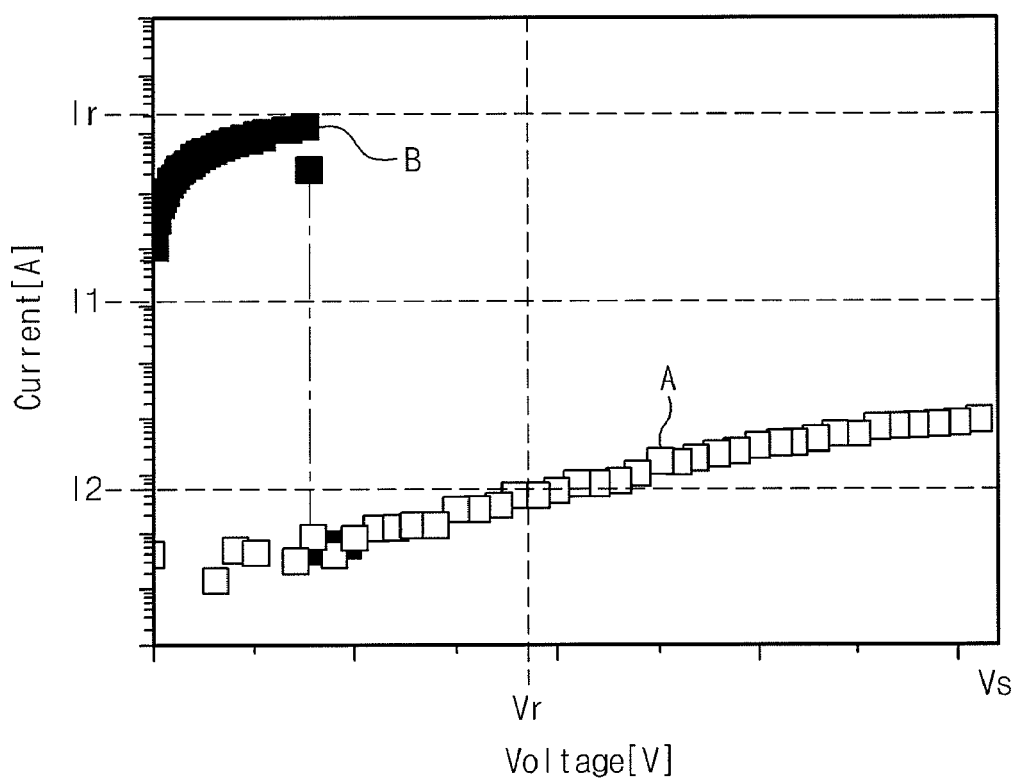
FIG. 8 illustrates a diagram of a change of a resistance value in the variable resistances of FIG. 7.

FIG. 8 illustrates a diagram of a change of a resistance value in the variable resistances 340 of FIG. 7. In FIG. 8, the x-axis represents a voltage applied to the variable resistances 340 and the y-axis represents a current flowing through the variable resistances 340. The curve A represents a voltage-current characteristic when the variable resistances 340 are in a first state (e.g., a high resistance state), and the curve B represents a voltage-current characteristic when the variable resistances 340 are in a second state (e.g., a low resistance state).

For example, when the variable resistances 340 are in the high resistance state, it is assumed that corresponding memory cells (e.g., MC1 to MCn and MCi and MCj) are in an erase state. Additionally, when the variable resistances 340 are in the low resistance state, it is assumed that corresponding memory cells (e.g., MC1 to MCn and MCi and MCj) are in a programmed state.

For example, when a voltage higher than a predetermined voltage Vs is applied to the variable resistances 340 of the memory cells MC1 to MCn and MCi and MCj in an erase state, the corresponding memory cells MC1 to MCn and MCi and MCj are programmed. When a current higher than a predetermined current Ir flows through the variable resistances 340 of the memory cells MC1 to MCn and MCi and MCj in a program state, the corresponding memory cells MC1 to MCn and MCi and MCj are erased.

That is, the variable resistance 340 is formed of a material that is programmed by a voltage and erased by a current. For example, the variable resistance layers 340 are formed of one of variable resistance materials, e.g., titanium oxide (TiOx), tungsten oxide (WOx), copper silicon dioxide (Cu:SiO2), silver germanium sulfide (Ag:GeS), and silver germanium selenide (Ag:GeSe). Hereinafter, a voltage for programming the memory cells MC1 to MCn is defined as a program voltage Vpgm and a current for erasing the memory cells MC1 to MCn is defined as an erase current Ie1.

Figure 9:
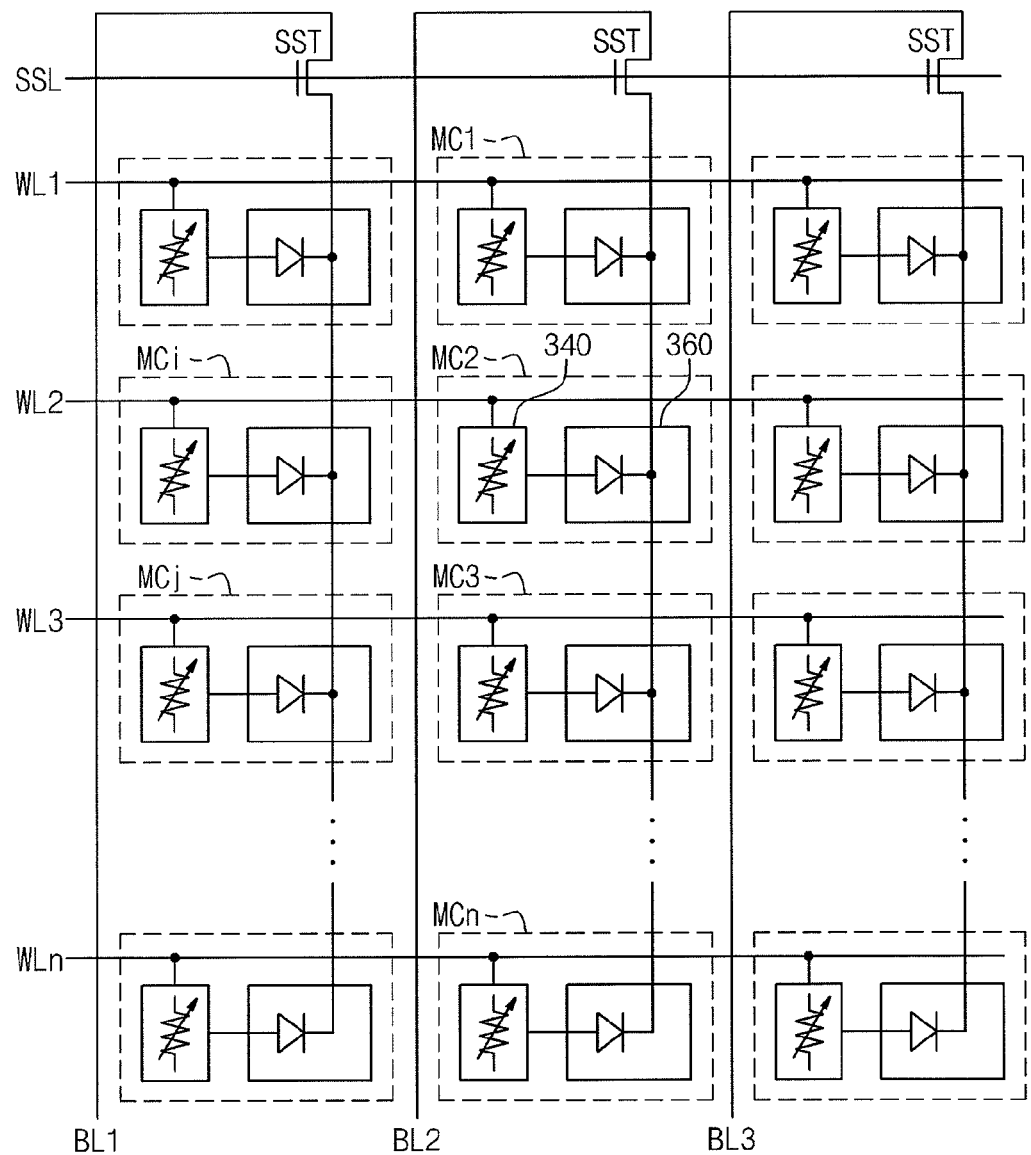
FIG. 9 illustrates a partial circuit diagram of an equivalent circuit during program and read operations of the memory cell array described with reference to FIGS. 3 to 6.
Figure 10:
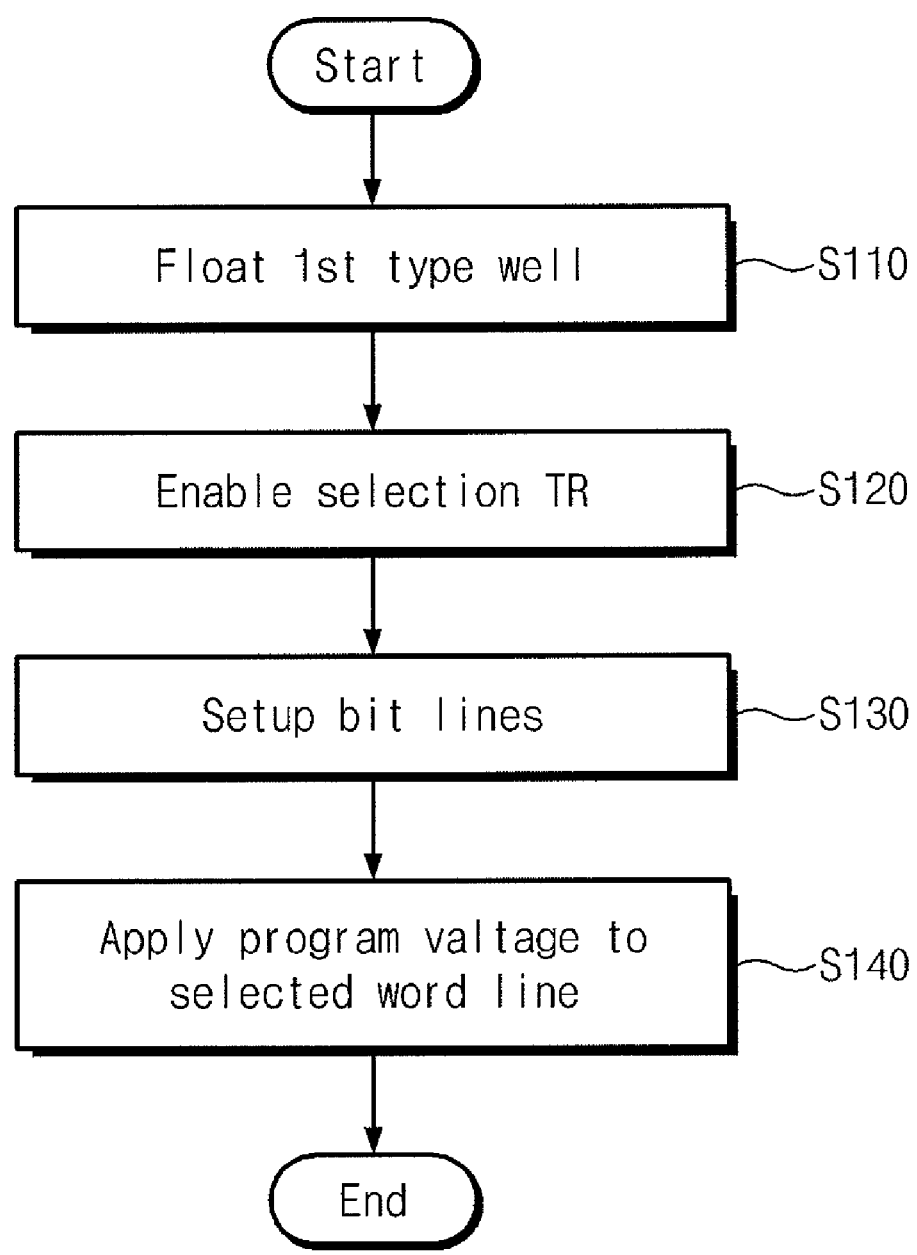
FIG. 10 illustrates a flowchart of a program operation of the memory cell array described with reference to FIGS. 3 to 6.

FIG. 9 illustrates a partial circuit diagram of an equivalent circuit during program and read operations of the memory cell array 210 described with reference to FIGS. 3 to 6. FIG. 10 illustrates a flowchart of a program operation of the memory cell array 210 described with reference to FIGS. 3 to 6.

Referring to FIGS. 8 to 10, the first type wells 310 are floated in operation S110. At this point, the second type wells 320 and the first type structures 330 form a P-N junction. That is, as shown in FIG. 9, the selection devices 360 operate as diodes.

In operation S120, the string selection transistor SST is activated. The first type well 315 is biased to a predetermined voltage. For example, the first type well 315 is biased to operate as a body of the string selection transistor SST. For example, the first type structures 315 are grounded.

The string selection line SSL is biased to a predetermined voltage. For example, the string selection line SSL is biased to turn on the string selection transistor SST. According to a voltage level of the string selection line SSL, the upper limit of a current amount that flows through the string selection transistor SST is determined. For example, a voltage of the string selection line SSL is configured to allow a string current amount to be less than an erase current amount. That is, the memory cells MC1 to MCn and MCi and MCj are prevented from being erased due to a current flowing from the word lines WL1 to WLn into the memory cells MC1 to MCn and MCi and MCj and a current flowing into the bit lines BL1 to BL3 through the string selection transistors SST. Hereinafter, it is assumed that the string current is a current I1 shown in FIG. 8.

In operation S130, the bit lines BL1 to BL3 are set up. For example, the bit lines BL1 to BL3 are set up based on program data loaded in the bit line driver and sense circuit 240. For example, when program data corresponding to the bit line BL1 is '0', the bit line BL1 is selected. When each program data corresponding to the bit lines BL2 and BL3 is '1', the bit lines BL2 and BL3 are not selected. However, it is understood that the inventive concept is not limited to the above case where the bit line is selected when program data is '0' and the bit line is not selected when program data is '1'.

For example, a ground voltage Vss is applied to the selection bit line BL1, and a program prohibit voltage Vihb is applied to the non-selection bit lines BL2 and BL3. Since the string selection transistors SST are activated, voltages set in the bit lines BL1 to BL3 are delivered to the second type wells 320 through the string selection transistors SST.

In operation S140, a program voltage Vpgm is applied to the selection word line (e.g., WL2). Then, a ground voltage Vss is applied to the non-selection word lines WL1 and WL3 to WLn.

During a program operation, a bias condition applied to an anode and a cathode of the selection device 360 may be defined as in Table 1.

TABLE 1

|  | SELECTION WORD LINE | NON-SELECTION WORD LINE |
| --- | --- | --- |
| SELECTION BIT LINE | ANODE: PROGRAM VOLTAGE (Vpgm) CATHODE: GROUND VOLTAGE (Vss) | ANODE: GROUND VOLTAGE (Vss) CATHODE: GROUND VOLTAGE (Vss) |
| NON-SELECTION BIT LINE | ANODE: PROGRAM VOLTAGE (Vpgm) CATHODE: PROGRAM PROHIBIT VOLTAGE (Vihb) | ANODE: GROUND VOLTAGE (Vss) CATHODE: PROGRAM PROHIBIT VOLTAGE (Vihb) |

Hereinafter, the memory cell MC2 connected between the selection word line WL2 and the selection bit line BL2 is described. A program voltage Vpgm is applied to the anode of the selection device 360 of the memory cell MC2 and a ground voltage Vss is applied to the cathode of the memory cell MC2. For example, the program voltage Vpgm is configured to turn on the selection device 360 of the memory cell MC2 and program the variable resistance 340 of the memory cell MC2 from a high resistance state to a low resistance state.

When the selection device 360 is turned on, a current flows through the variable resistance 340 and the selection device 360. When the variable resistance 340 of the memory cell MC2 is programmed, i.e., the memory cell MC2 is programmed, a current amount flowing through the programmed memory cell MC2 (hereinafter, it will be referred to as a program cell current) will be increased.

The string selection transistor SST limits a current amount flowing from the string of the memory cells MC1 to MCn to the bit line BL2. An amount of a current flowing through the string selection transistor SST cannot be greater than an amount of the string current I1. That is, an amount of a program cell current cannot be greater than an amount of the string current I1 Also, an amount of the string current I1 is less than an amount of the erase current Ie1. That is, an amount of a program cell current is less than an amount of the erase current Tel. Accordingly, the programmed memory cell MC2 is prevented from being erased again due to the program cell current.

Hereinafter, the memory cell MC3 corresponding to the non-selection word line WL3 and the selection bit line BL2 is described. However, it is understood that the bias condition of the memory cell MC3 described below is applied to all memory cells corresponding to the non-selection word lines WL1 and WL3 to WLn and the selection bit line BL2.

A ground voltage Vss is applied to the anode of the selection device 360 of the memory cell MC3, and a ground voltage Vss is applied to the cathode of the memory cell MC3. At this point, the selection device 360 of the memory cell MC3 is turned off. When the selection device 360 of the memory cell MC3 is turned off, a voltage applied to the variable resistance 340 of the memory cell MC3 is minimized. For example, when the selection device 360 is turned on, the variable resistance 450 is electrically separated from the selection bit line BL2. Accordingly, the memory cell MC3 is not programmed.

Hereinafter, the memory cell MCi corresponding to the selection word line WL2 and the non-selection bit line BL1 is described. However, it is understood that the bias condition of the memory cell MCi described below is applied to all memory cells corresponding to the selection word lines WL2, and the non-selection bit line BL1 and BL3.

A program voltage Vpgm is applied to the anode of the selection device 360 of the memory cell MCi, and a program prohibit voltage Vihb is applied to the cathode of the memory cell MCi. For example, the program prohibit voltage Vihb is configured to turn on the selection device 360 of the memory cell MCi when a program voltage Vpgm is applied to the anode of the selection device 360 of the memory cell MCi. For example, the program prohibit voltage Vihb is configured to have a higher level than a level of a difference of the program voltage Vpgm and a threshold voltage of the selection device 360. That is, the selection device 360 is turned off. Accordingly, the memory cell MCi is not programmed.

Hereinafter, the memory cell MCj corresponding to the non-selection word line WL1 and the non-selection bit line BL1 is described. However, it is understood that the bias condition of the memory cell MCj described below is applied to all memory cells corresponding to the non-selection word lines WL1 and WL3 to WLn and the non-selection bit lines BL1 and BL3.

A ground voltage Vss is applied to the anode of the selection device 360 of the memory cell MCj, and a prohibit voltage Vihb is applied to the cathode of the memory cell MCj. That is, the selection device 360 of the memory cell MC3 is reverse-biased. Accordingly, the selection device 360 of the memory cell MCj is turned off, and the memory cell MCj is not programmed.

The memory cells MC1 to MCn and MCi and MCj are programmed using a program voltage. Also, a current amount flowing through the memory cells MC1 to MCn and MCi and MCj is restricted by the string selection transistor SST. That is, power consumption is reduced by the string selection transistor SST during a program operation. When power consumption is reduced during a program operation, it is possible to increase the number of simultaneously-programmed memory cells. For example, the memory cells may be programmed by a word line (or a page) unit.

For example, the program voltage is set within a range of 1 V to 3 V. A program voltage of a typical memory (e.g., a NAND flash memory) is 18 V to 20 V. Accordingly, it is understood that a voltage pumping function for raising a program voltage can be simplified when compared with a typical memory (e.g., a NAND flash memory).

In the above embodiment, an operation for biasing the first type wells 310 and 315 is performed in operation S110 and operation S120. However, the order in which the first type wells 310 and 315 are biased may be reversed or the first type wells 310 and 315 may be biased simultaneously.

Figure 11:
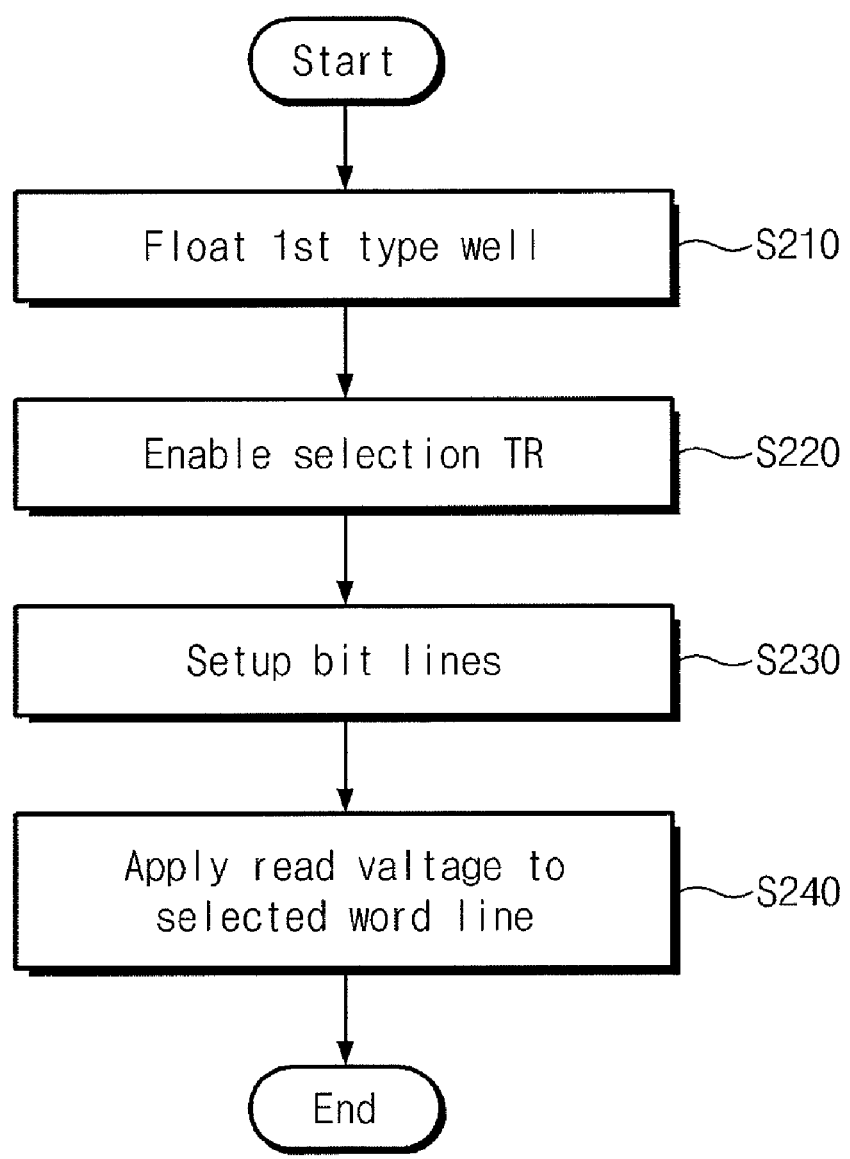
FIG. 11 illustrates a flowchart of a read operation of the memory cell array described with reference to FIGS. 3 to 6.

FIG. 11 illustrates a flowchart of a read operation of the memory cell array 210 described with reference to FIGS. 3 to 6. Referring to FIGS. 8, 9, and 11, the first type well 310 is floated in operation S210. That is, as shown in FIG. 9, the selection devices 360 operate as diodes.

In operation S220, the string selection transistor SST is activated. For example, the first type wells 315 may be biased as described with reference to FIG. 10. The string selection line SSL is biased to a predetermined voltage. For example, as described with reference to FIG. 10, the string selection line SSL is biased to allow an amount of a string current I1 to be less than an amount of an erase current Ie1.

In operation S230, the bit lines BL1 to BL3 are set up. For example, a ground voltage is applied to the bit lines BL1 to BL3. That is, the bit lines BL1 to BL3 are discharged. Later, the bit lines BL1 to BL3 will be floating.

In operation S240, a read voltage is applied to the selection word line WL2. Then, a ground voltage Vss is applied to the non-selection word lines WL1 and WL3 to WLn. Then, selection devices 360 connected to the non-selection word lines WL1 and WL3 to WLn will be turned off.

For example, a read voltage is configured to be lower than a program voltage Vpgm and is higher than a ground voltage Vss. The read voltage is configured to turn on the selection devices 360. For example, the read voltage is configured to be higher than a threshold voltage of the selection devices 360. For example, it is assumed that the read voltage is a voltage Vr shown in FIG. 8.

At this point, a current flowing through the memory cell MCi of an erase state corresponds to a current I2 of FIG. 8. A current amount flowing through the memory cell MC2 of a program state is restricted by the string selection transistor SST. That is, a current flowing through the memory cells MC2 of a program state corresponds to a string current I1 Hereinafter, a current flowing through the memory cell MCi of an erase state is defined as an off-cell current.

As shown in FIG. 8, when a read voltage Vr is applied to the selection word line WL2, an off-cell current I2 flows through the memory cell MCi of an erase state. Moreover, a string current I1 flows through the memory cell MC2 of a program state. An amount of the off-cell current I2 is less than an amount of the string current I1 Accordingly, an increase rate of a voltage of the bit line BL1 into which the off-cell current I2 flows is less than that of a voltage of the bit line BL2 into which the string current I1 flows. That is, a difference of the off cell current I2 and the string current I1 is used as a margin for determining an erase cell MCi and a program cell MC2.

When a read voltage Vr is applied to the selection word line WL2 and after a predetermined time (e.g., a sense time) elapses, a voltage of the bit lines BL1 to BL3 is sensed. For example, a voltage of the bit line BL2 corresponding to the program cell MC2 has a level close to a level of a difference of the read voltage Vr and a threshold voltage of the selection device 360. A voltage of the bit line BL1 corresponding to the erase cell MCi has a level close to a ground voltage Vss. Accordingly, it is possible to sense data stored in the selection memory cells by sensing a voltage of the bit lines BL1 to BL3.

For example, a voltage of the bit lines BL1 to BL3 is sensed by the bit line driver and sense circuit 240 of FIG. 2. For example, the bit line driver and sense circuit 240 uses a typical circuit such as a page buffer or a sense amplifier to sense a voltage of the bit lines BL1 to BL3.

For example, capacitances of the bit lines BL1 to BL3 are 1 pF to 3 pF, respectively. The read voltage Vr is 1 V. The string current I1 is set to $10^{-6}$ A. At this point, the off cell current I2 is $10^{-9}$ A. That is, when the read voltage is 1 V and a string current I1 is set to $10^{-6}$ A, the string current I1 is 100 times greater than the off cell current I1.

When the string current I1 is set to $10^{-6}$ A, a sensing time is 1 μs to 3 μs. When the string current I1 is set to $10^{-5}$ A, the sensing time is reduced to 0.1 μs to 0.3 μs. A reading time of a typical memory (e.g., a NAND flash memory) is 1 μs to 3 μs. That is, when the string current I1 is increased, a faster reading speed than the typical memory (e.g., a NAND flash memory) can be provided. Additionally, when the string current I1 is increased, a reading margin can be improved. Accordingly, it is understood that the string current I1 is determined by considering power consumption, reliability, and reading time.

For example, a read voltage is 1 V. A read voltage of a typical memory (e.g., a NAND flash memory) is 0 V to 10 V. Accordingly, it is understood that a voltage pumping function for raising a program voltage can be simplified when compared with a typical memory (e.g., a NAND flash memory).

In the above embodiment, an operation for biasing the first type wells 310 and 315 is performed in operation S210 and operation S220. However, the order in which the first type wells 310 and 315 are biased may be reversed or the first type wells 310 and 315 may be biased simultaneously.

Figure 12:
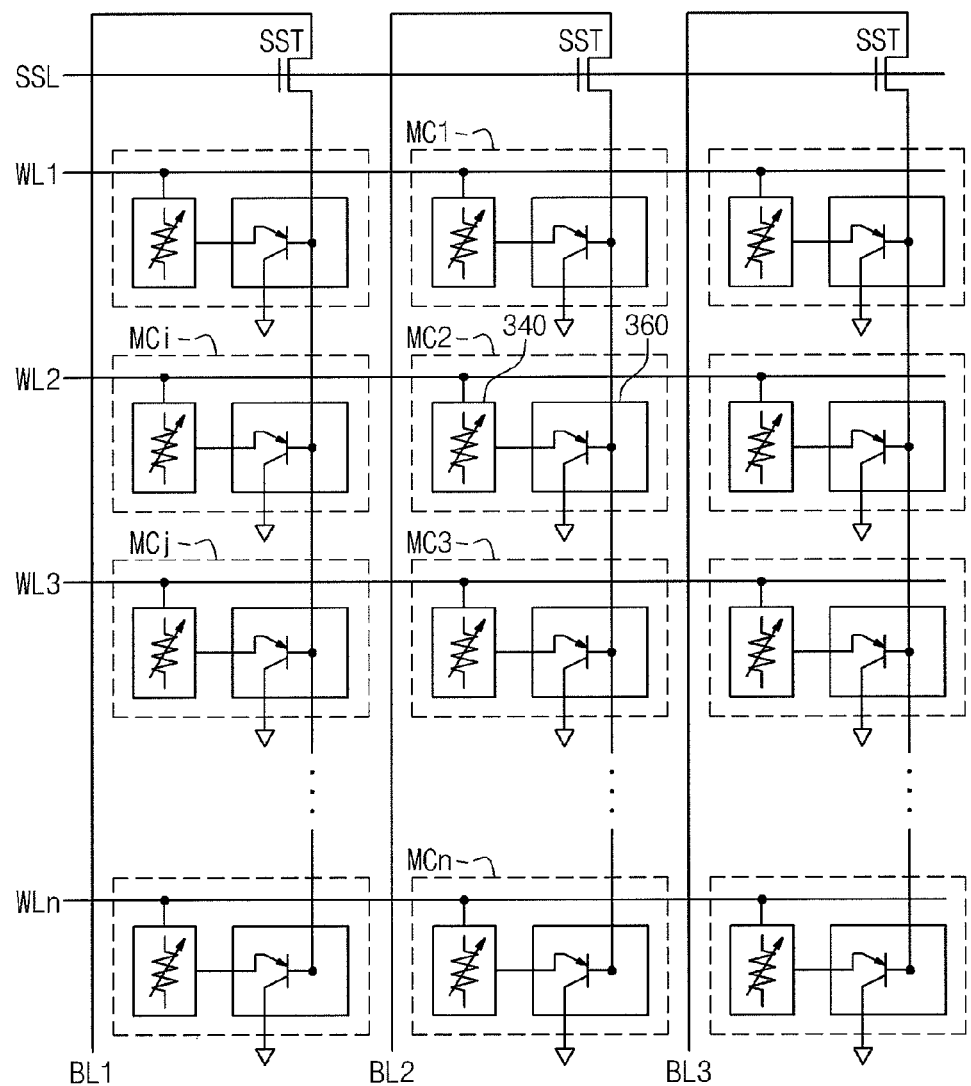
FIG. 12 illustrates a partial circuit diagram of an equivalent circuit during an erase operation of the memory cell array described with reference to FIGS. 3 to 6.
Figure 13:
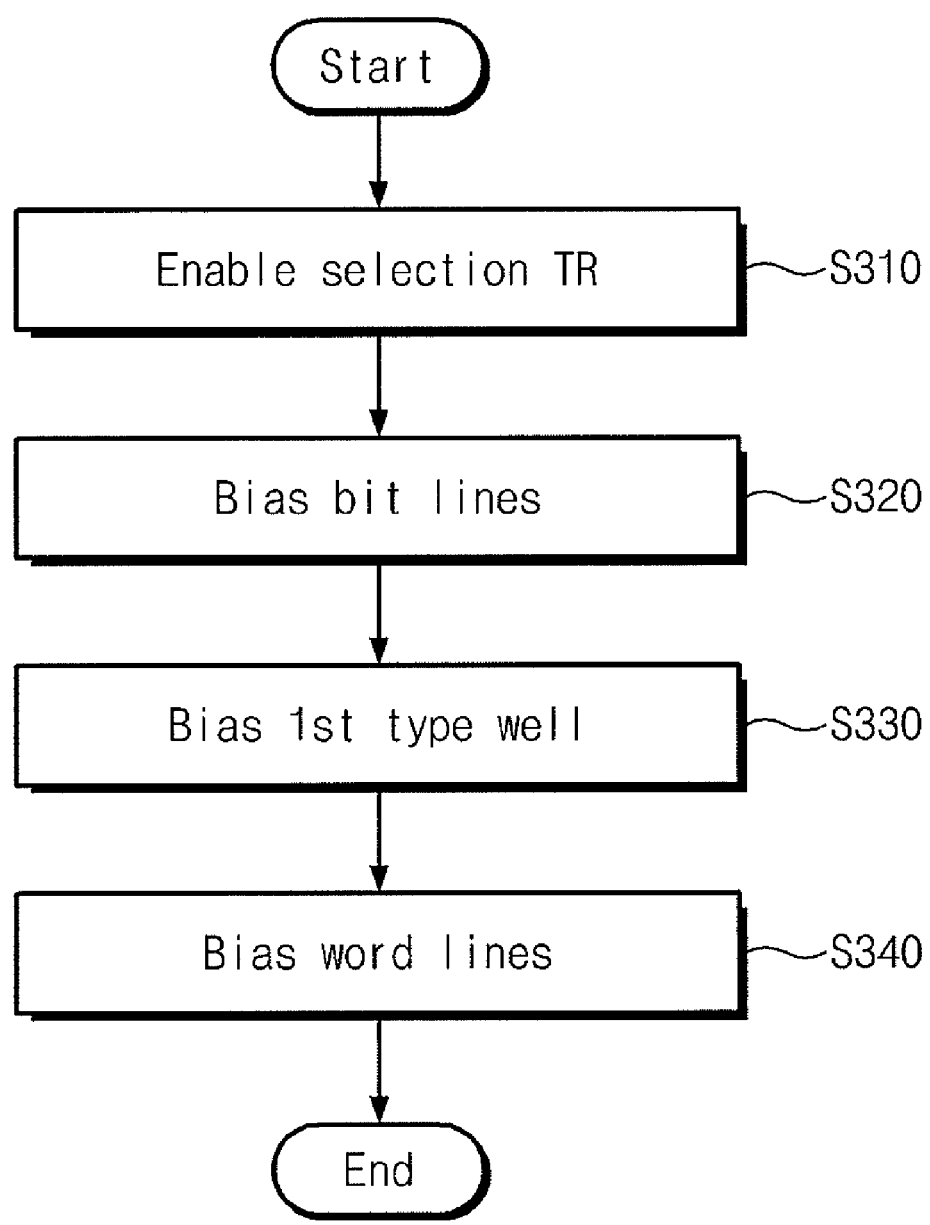
FIG. 13 illustrates a flowchart of an erase operation of the memory cell array described with reference to FIGS. 3 to 6.

FIG. 12 illustrates a partial circuit diagram of an equivalent circuit during an erase operation of the memory cell array 210 described with reference to FIGS. 3 to 6. FIG. 13 illustrates a flowchart of an erase operation of the memory cell array 210 described with reference to FIGS. 3 to 6.

Referring to FIGS. 3 to 6, 8, 12, and 13, the selection transistor SST is activated in operation 5310. For example, the first type wells 315 and the string selection line SSL are biased as described with reference to FIGS. 9 to 11.

In operation S320, the bit lines BL1 to BL3 are biased. For example, the bit lines BL1 to BL3 will be biased with a ground voltage Vss. The ground voltage Vss is provided to the second type wells 320 through the string selection transistor SST. That is, the second type wells 320 will be biased with the ground voltage Vss.

In operation S330, the first type well 310 is biased. For example, the first type well 310 is biased with a first erase voltage Ver1.

In operation S340, the word lines WL1 to WL3 are biased. For example, the word lines WL1 to WLn will be biased with a second erase voltage Ver2. The second erase voltage Ver2 is delivered to the first type structure 330 through the variable resistance layer 340.

For example, the first erase voltage Ver1 has a lower level than a ground voltage Vss. In addition, the second erase voltage Ver2 has a higher level than a ground voltage Vss. That is, as shown in FIG. 12, a selection device 360 including the first type structure 340, the second type well 320, and the first type well 310 operates as a transistor. In more detail, the selection device 360 operates as a pnp Bipolar Junction Transistor (BJT).

The first type well 310 operates as a collector of the selection device 360. The second type well 320 operates as a base of the selection device 36. The first type structure 330 operates as an emitter of the selection device 360. That is, the ground voltage Vss is applied to the base of the selection device 360, the second erase voltage Ver2 is applied to the emitter, and the first erase voltage Ver1 is applied to the collector.

A first current (e.g., a base current) flows from the word lines WL1 to WLn to the base through the emitter of the selection device 360. A second current (e.g., a collector current) flows from the word lines WL1 to WLn to the collector through the emitter of the selection device 360. An amount of the second current is larger than that of the first current. In more detail, the first current amount and the second current amount will be determined by an alpha value (or beta value) of the selection device 360.

The first current flows into the bit lines BL1 to BL3 through the string selection transistor SST. An amount of the first current cannot be greater than an amount of the string current I1 of FIG. 8. However, the second current amount is not restricted by the string selection transistor SST. That is, an amount of the second current amount may be greater than an amount of the first current and the string current I1.

The current flowing from the word lines WL1 to WLn to the emitter of the selection device 360, i.e., an emitter current, is the sum of the first current (a base current) and the second current (a collector current). The emitter current may be greater than the string current I1. The emitter current is delivered from the word lines WL1 to WLn to the emitter of the selection device 360 through the variable resistance 340. That is, the current flowing through the variable resistance 340 may be greater than the string current I1. Accordingly, by adjusting levels of the first and second erase voltages Ver1 and Ver2, it is possible to erase the memory cells MC1 to MCn. That is, by setting the selection device 360 as a transistor, an erase current Ie1 is provided to the memory cells MC1 to MCn bypassing the string selection transistor SST.

When the bit lines BL1 to BL3 and the word lines WL1 to WLn corresponding to the first type well 310 are biased, an erase operation can be performed by the first type well 310. For example, when the memory cells MC1 to MCn on the first type well 310 forms a memory block, the variable resistance memory 200 of the inventive concept can perform an erase operation by a memory block unit.

For example, when the first type wells 310 are separated corresponding to each of the word lines WL1 to WLn, the variable resistance memory 200 of the inventive concept can perform an erase operation by a word line unit. For example, when the first type wells 310 are separated corresponding to each of the bit lines BL1 to BLn, the variable resistance memory 200 of the inventive concept can perform an erase operation by a bit line unit. That is, it is understood that an erase operation unit of the variable resistance memory 200 may vary according to forms of the first type well 310.

For example, the first erase voltage Ver1 may be set within a range of −0.5 V to −3 V. The second erase voltage Ver2 may be set within a range of 0.5 V to 3 V. A read voltage of a typical memory (e.g., a NAND flash memory) is 18 V to 20 V. Accordingly, it is understood that a voltage pumping function for raising an erase voltage can be simplified when compared with a typical memory (e.g., a NAND flash memory).

As mentioned above, the memory cell MC2 corresponding to the selection word line WL2 and the selection bit line BL2 is selectively programmed when a program voltage Vpgm is applied to the selection word line WL2, a ground voltage Vss is applied to the non-selection word lines WL1 and WL3-WLn, a ground voltage Vss is applied to the selection bit line BL2, and a program prohibit voltage Vihb is applied to the non-selection bit lines BL1 and BL3. Additionally, by bypassing the string selection transistor SST, the programmed memory cells are prevented from being erased due to the program cell current.

As mentioned above, it is possible to sense data stored in the memory cells corresponding to the selection word line WL2 by discharging the bit lines BL1 to BL3, biasing the word line WL2 with the read voltage Vr, and biasing the non-selection word lines WL1 and WL3 to WLn with the ground voltage Vss. Additionally, the string current I1 may be adjusted by considering tradeoffs between a reading speed, reliability, and power consumption.

As mentioned above, the selection device 360 is set as a diode during program and read operations, and the selection device 360 is set as a transistor during an erase operation. Accordingly, the memory cells MC1 to MCn are erased bypassing the string selection transistor SST.

As mentioned above, compared with a typical memory (e.g., a NAND flash memory), the variable resistance memory 200 of the inventive concept uses a program voltage, a read voltage, and an erase voltage of a low level. Accordingly, a voltage pumping function for raising a voltage can be simplified.

As mentioned above, compared with a typical memory (e.g., a NAND flash memory), the variable resistance memory 200 of the inventive concept has an improved operational characteristic. Additionally, the variable resistance memory 200 of the inventive concept uses a variable resistance layer (that does not limit the number of program and erase operations) to store data. Accordingly, compared with a typical memory (e.g., a NAND flash memory) that limits the number of program erase operations, the variable resistance memory 20 of the inventive concept has improved reliability.

Hereinafter, a variable resistance memory according to a second embodiment will be described. The variable resistance memory according to the second embodiment has the same configuration as the variable resistance memory of FIGS. 3 to 6 except for a variable resistance layer. Accordingly, the variable resistance memory according to the second embodiment will be described with reference to FIGS. 3 to 6. The variable resistance memory according to the second embodiment is designated with the reference number 200', the memory cell is designated with the reference number 210', and the variable resistance layer and variable resistance are designated with the reference number 340'.

The variable resistance layer 340' of the variable resistance memory 200' according to the second embodiment is programmed by a forward bias current Ifor, and is erased by a reverse bias current Irev. For example, when a forward bias current (e.g., a program current Ipgm) of more than a predetermined amount is applied to the variable resistance layer 340', the variable resistance layer 340' is programmed. For example, when a reverse bias current (e.g., an erase current Ie2) of more than a predetermined amount is applied to the variable resistance layer 340', the variable resistance layer 340' is erased.

For example, as described with reference to FIG. 8, the variable resistance layer 340' of an erase state may be in a high resistance state. The variable resistance layer 340' of a program state may be in a low resistance state. For example, the variable resistance layer 340' is formed of one of NiOx and AlOx.

For example, assume that a current flowing from the word lines WL1 to WLn to the bit lines BL1 to BL3 through the memory cells MC1 to MCn is a forward bias current Ifor. That is, as described with reference to FIGS. 9 to 11, the forward bias current Ifor can be provided to the memory cells MC1 to MCn by setting the selection device 360 as a diode. Moreover, as described with reference to FIGS. 12 to 13, the forward bias current Ifor can be provided to the memory cells MC1 to MCn by setting the selection device 360 as a diode.

When the program current Ipgm is provided as the forward bias current Ifor, the memory cells MC1 to MCn will be programmed.

Figure 14:
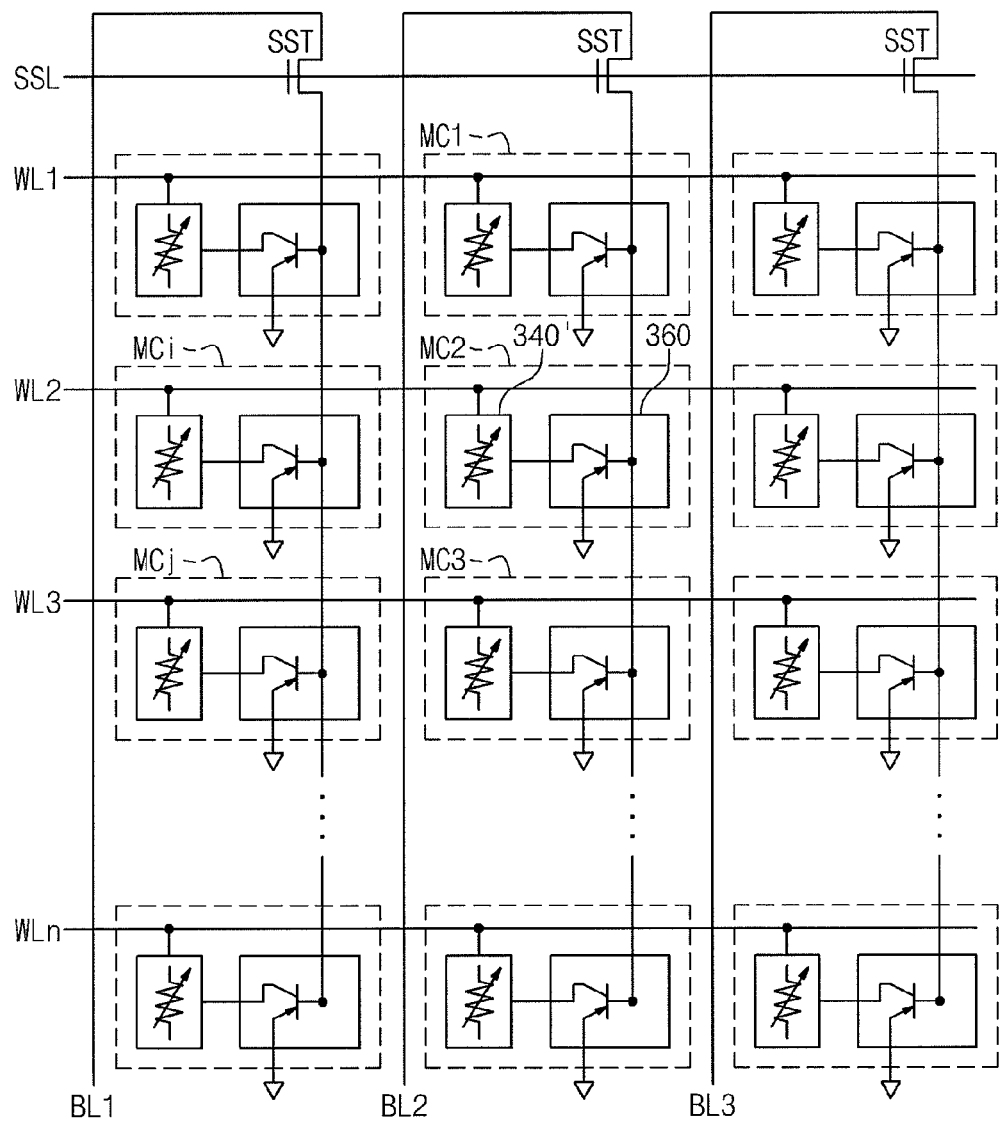
FIG. 14 illustrates a partial circuit diagram of an equivalent circuit of the memory cell array for providing a reverse bias current to the memory cells.

FIG. 14 illustrates a partial circuit diagram of an equivalent circuit of the memory cell array 210' for providing a reverse bias current Irev to the memory cells MC1 to MCn. Referring to FIGS. 3 to 6 and 14, a third erase voltage Ver3 is biased to the first type well 310. A ground voltage Vss is provided from the bit line BL1 to BL3 to the second type wells 320 through the string selection transistor SST. In addition, a fourth erase voltage Ver4 is applied to the word lines WL1 to WLn. The fourth erase voltage Ver4 is delivered to the first type structure 330 through the variable resistance layer 340'.

For example, the third erase voltage Ver3 has a higher level than the ground voltage Vss. The fourth erase voltage Ver4 has a lower level than a ground voltage Vss. At this point, as shown in FIG. 14, the selection devices 360 operate as a pnp BJT. The first type well 310 corresponds to an emitter of the selection device 360, the second type well 320 corresponds to a base of the selection device 360, and the first type structure 330 corresponds to a collector of the selection device 360.

A collector current flows from the selection device 360 to the word line WL1 to WLn through the variable resistance 340. Accordingly, it is possible to provide a reverse bias current Irev to the memory cells MC1 to MCn. That is, when the erase current Ie2 is provided as the reverse bias current Irev, the memory cells MC1 to MCn will be erased.

For example, as described with reference to FIGS. 9 and 11, a read operation is performed by setting the selection device 360 as a diode, discharging the bit lines BL1 to BL3, and applying a read voltage to the selection word line. At this point, the forward bias current Ifor flows through the memory cells MC1 to MCn. A current amount flowing through the memory cells of an erase state (i.e., a high resistance state) may be less than that flowing through the memory cells of a program state (i.e., a low resistance state).

When a level of the read voltage Vr2 is adjusted, a current amount flowing through the memory cells MC1 to MCn is controlled. If a current amount flowing through erase cells is less than a program current Ipgm, the erase cells are not programmed during a read operation. That is, by adjusting a level of the read voltage Vr2, erase cells are prevented from being programmed due to a read voltage Vr2.

Additionally, the string selection line SSL is controlled to allow a string current amount to be less than a program current amount. At this point, it is prevented that erase cells are programmed due to the read voltage Vr2. Additionally, program cells are prevented from being over-programmed due to the read voltage Vr2.

When the string current amount is less than the program current amount, a program operation is performed by setting the selection device 360 as a BJT. That is, when the string current amount is restricted by the string selection transistor SST, the program current Ipgm is provided to the memory cells MC1 to MCn bypassing the string selection transistor SST.

Like the variable resistance memory 200 according to the first embodiment, the variable resistance memory 200' according to the second embodiment has improved operational characteristic and reliability than a typical memory (e.g., a NAND flash memory). First, program, read, and erase voltages are lower than voltages of a typical memory (e.g., a NAND flash memory). Additionally, the number of program and erase operations of the variable resistance 340' is not restricted.

Figure 15:
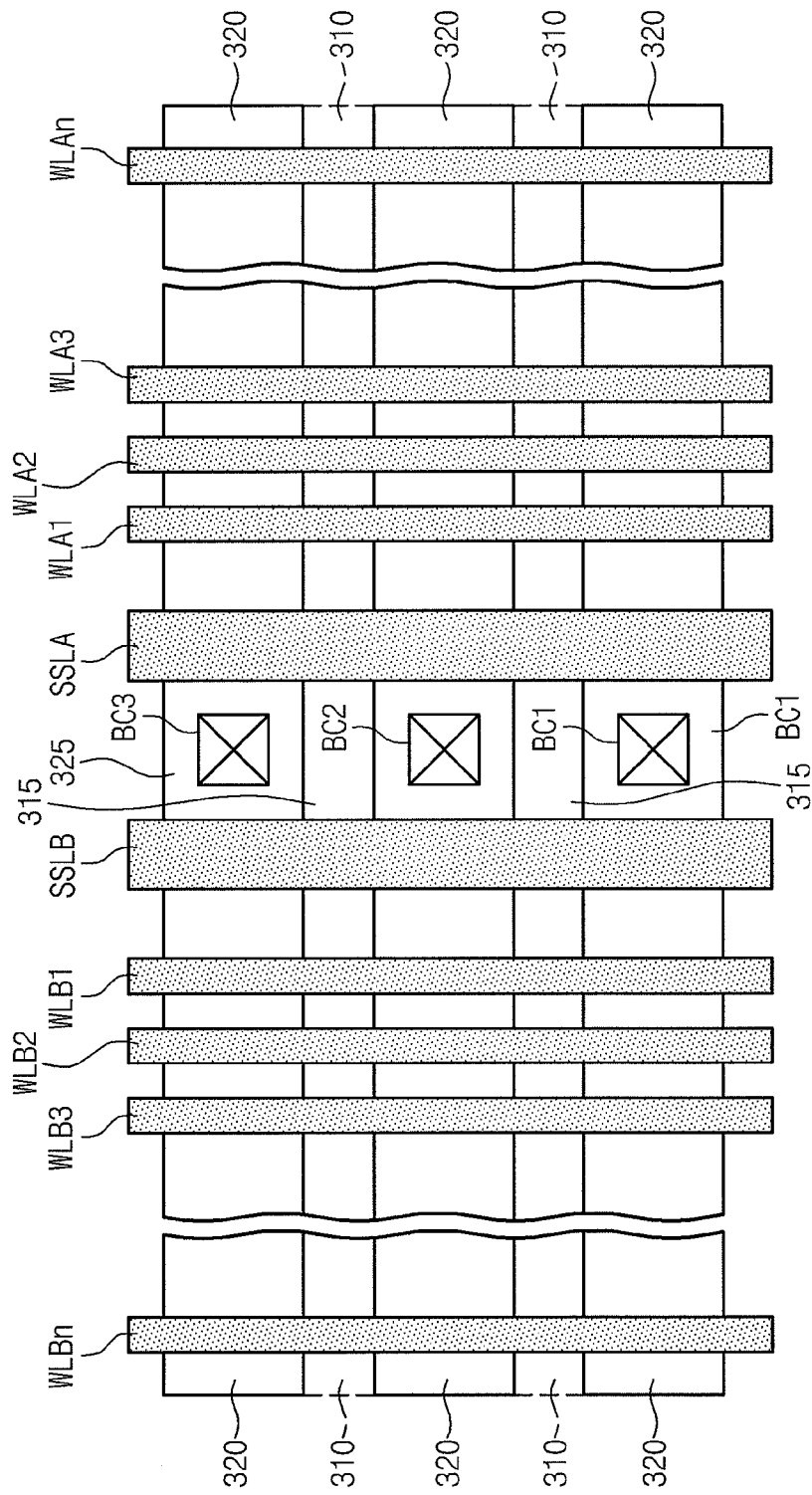
FIG. 15 illustrates a plan view of a variable resistance memory according to a third embodiment.
Figure 16:
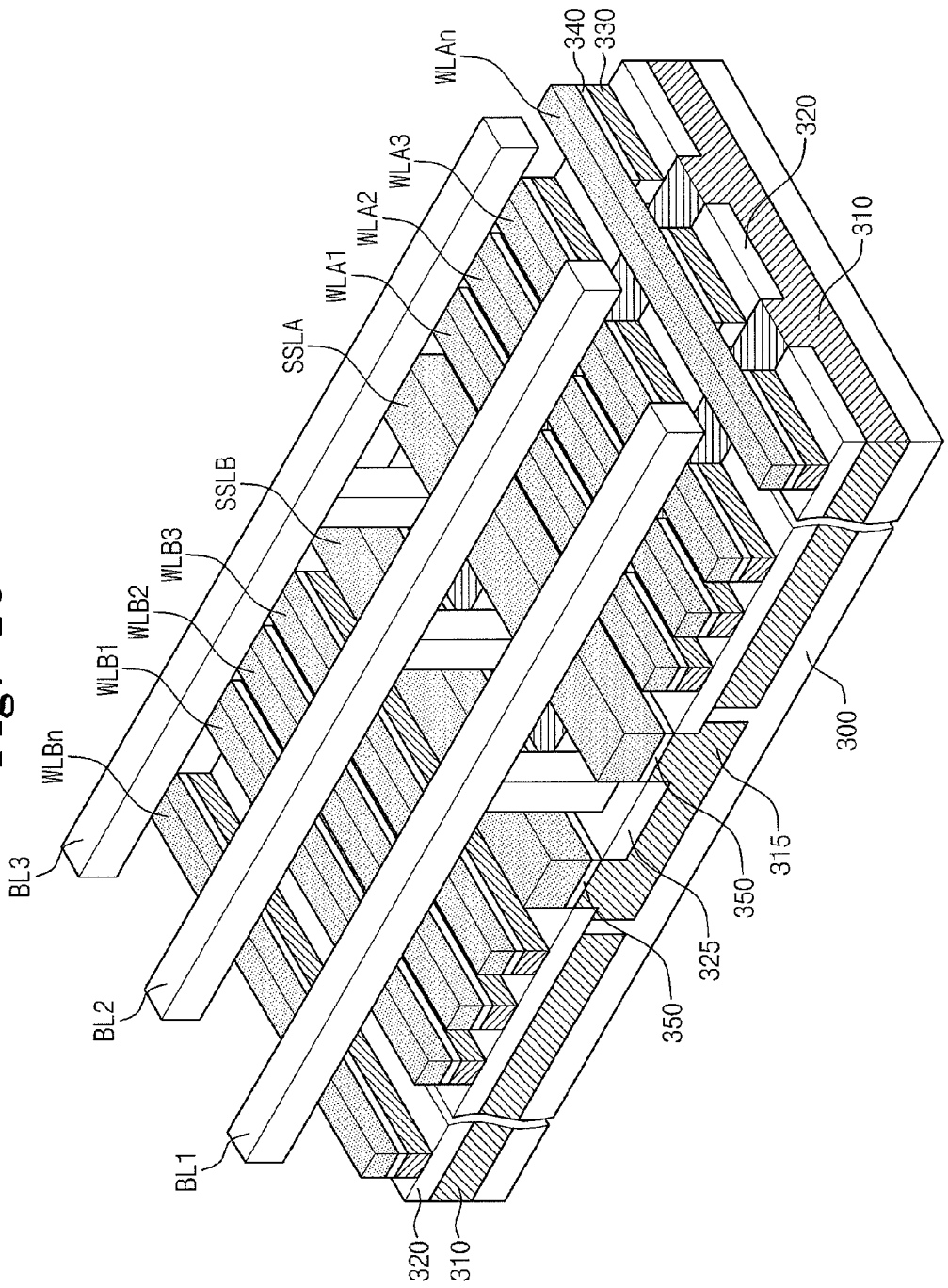
FIG. 16 illustrates a perspective view of the variable resistance memory according to the third embodiment.

FIG. 15 illustrates a plan view of a variable resistance memory according to a third embodiment. FIG. 16 illustrates a perspective view of the variable resistance memory according to the third embodiment. Referring to FIGS. 15 and 16, two first type wells 310 are disposed based on the bit line contacts BC1 to BC3. Cell structures CS, switch structures SS, string selection lines SSLA and SSLB, and word lines WLA1 to WLAn and WLB1 to WLBn are disposed on the first type wells 310. That is, two memory blocks are configured to share the bit lines BL1 to BL3. It is understood that the number of memory blocks sharing the bit lines BL1 to BL3 is not restricted.

Figure 17:
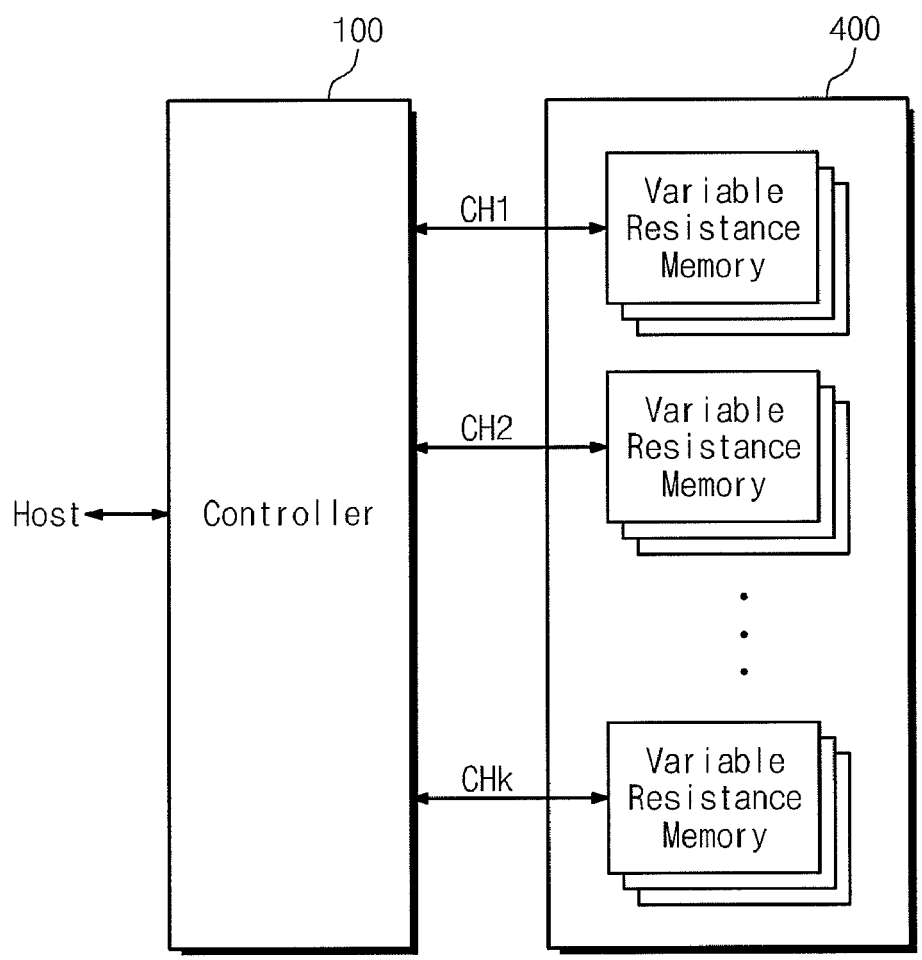
FIG. 17 illustrates a block diagram of another embodiment of the memory system of FIG. 1.

FIG. 17 illustrates a block diagram of another embodiment of the memory system 10 of FIG. 1. Referring to FIG. 17, a memory system 20 includes a controller 100 and a variable resistance memory device 400. The memory cell array 400 includes a plurality of variable resistance memory chips. A plurality of variable resistance memory chips are divided into a plurality of groups. Each group of the variable resistance memory chips is configured to communicate with the controller 100 through one channel. In FIG. 17, the plurality of variable resistance memory chips communicate with the controller 100 through first to k channels CH1 to CHk. Each variable resistance memory chip will be configured as described with reference to the FIGS. 2 to 6.

Figure 18:
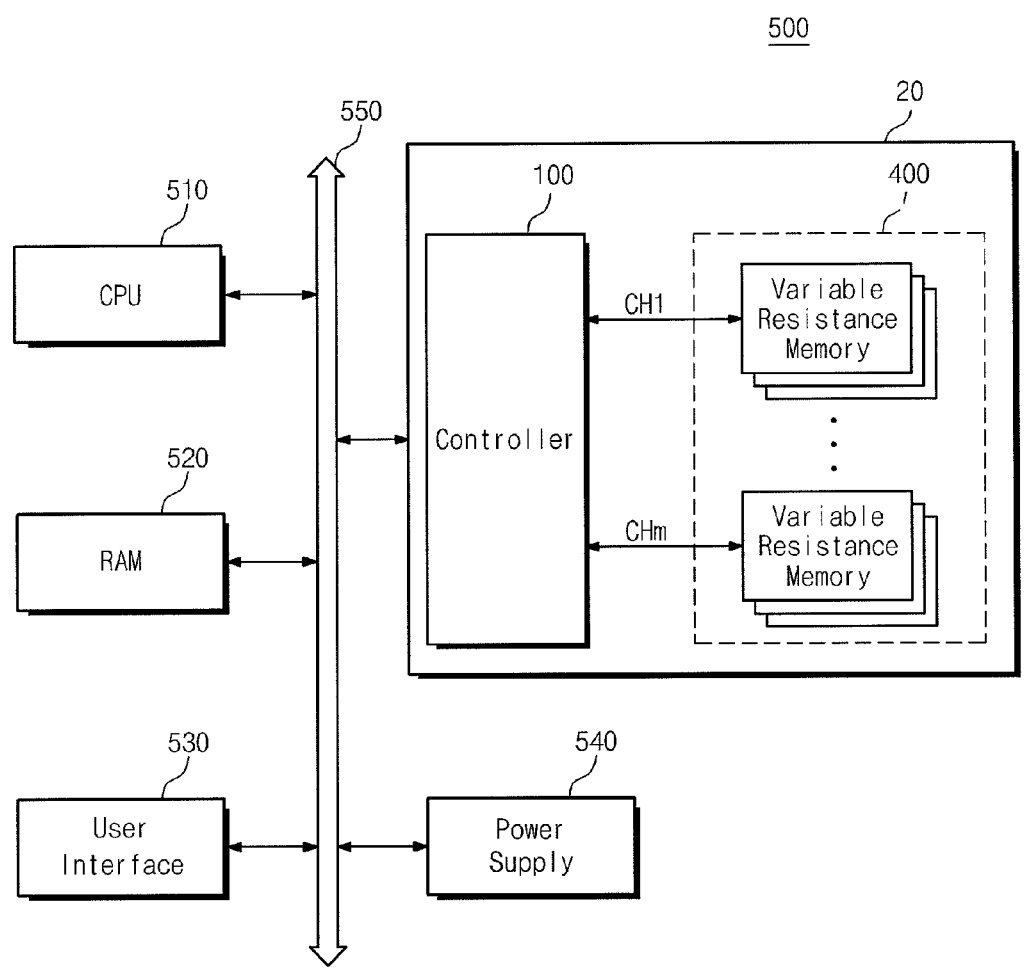
FIG. 18 illustrates a block diagram of a computing system including the memory system of FIG. 17.

FIG. 18 illustrates a block diagram of a computing system 500 including the memory system 20 of FIG. 17. Referring to FIG. 18, the computing system 500 includes a central processing unit (CPU) 510, a random access memory (RAM) 520, a user interface 530, a power supply 540, and the memory system 20.

The memory system 20 is electrically connected to the CPU 510, the RAM 520, the user interface 530, and the power supply 540 through a system bus 550. Data provided from the user interface 530 or processed by the CPU 510 are stored in the memory system 20. The memory system 20 includes the controller 100 and a variable resistance memory device 400.

For example, the variable resistance memory device 400 includes a plurality of variable resistance memory chips. A plurality of variable resistance memory chips are divided into a plurality of groups. Each group of the variable resistance memory chips is configured to communicate with the controller 100 through a common channel. In FIG. 18, the plurality of variable resistance memory chips communicate with the controller 100 through first to m channels CH1 to CHm.

When, the memory system 20 is mounted as a semiconductor drive (e.g., SSD), a booting speed of the computer system 500 can be drastically improved. Although not illustrated, it is apparent to those skilled in the art that the system of the inventive concept may further include an application chipset, a camera image processor, etc.

According to the inventive concept, it is possible to provide a variable resistance memory with improved reliability and operational characteristics.

Although specific embodiments are described in the detailed description, it is apparent to those skilled in the art that various changes in form and details may be made therein without departing from the spirit and scope of the inventive concept. Therefore, the scope of the inventive concept should not be limited to the above-mentioned embodiments and should be defined by the following claims and the equivalents thereof.

What is claimed is:

1. A variable resistance memory array, comprising:
at least one variable resistance memory cell,
wherein each variable resistance memory cell includes:
a well having a first type; and
a cell structure on the well, the cell structure including a structure having a second type different from the first type and a variable resistance layer on the structure,
wherein a second well is provided below the well, at least two variable resistance memory cells are provided on the second well, and the second well is floated during a program or read operation of the at least two variable resistance memory cells.

2. The variable resistance memory array as claimed in claim 1, further comprising a switch device for controlling an amount of current flowing between the well and a conductive line.

3. The variable resistance memory array as claimed in claim 2, wherein an amount of current flowing through the switch device is less than an amount of current changing a state of the variable resistance layer.

4. The variable resistance memory array as claimed in claim 3, wherein the current changing a state of the variable resistance layer is provided to the variable resistance layer by bypassing the switch device.

5. The variable resistance memory array as claimed in claim 1, wherein the second well has the second type.

6. The variable resistance memory array as claimed in claim 5, wherein the structure, the well, and the second well operate as a transistor.

7. The variable resistance memory array as claimed in claim 5, wherein the second well extends in a first direction and a second direction to form a memory block.

8. The variable resistance memory array as claimed in claim 7, wherein the at least two variable resistance memory cells share the second well.

9. The variable resistance memory array as claimed in claim 1, wherein the well is extended in a second direction, and wherein the at least two variable resistance memory cells share the extended well.

10. The variable resistance memory array as claimed in claim 9, wherein a conductor is provided on the cell structure, wherein the conductor is extended in a second direction, and wherein the at least two variable resistance memory cells share the extended conductor.

11. The variable resistance memory array as claimed in claim 9, wherein the well is connected to a bit line through a switch.

12. The variable resistance memory array as claimed in claim 1, wherein the well having the first type and the structure having the second type operate as a diode.

13. The variable resistance memory array as claimed in claim 1, wherein the well provides a channel between cells arranged in a second direction among the at least one variable resistance memory cell.

14. A variable resistance memory device, comprising:
a memory array including at least one variable resistance memory cell;
a word line driver biasing at least one word line connected to the at least one variable resistance memory cell; and
a bit line driver and sense circuit biasing bit lines connected to the at least one variable resistance memory cell through at least one bit line and sensing a voltage of the at least one bit line,
wherein each variable resistance memory cell includes:
a well having a first type; and
a cell structure on the well, the cell structure including a structure having a second type different from the first type and a variable resistance layer on the structure,
wherein a second well is provided below the well, at least two variable resistance memory cells are provided on the second well, and the second well is floated during a program or read operation of the at least two variable resistance memory cells.

15. The variable resistance memory device as claimed in claim 14, wherein the well is extended in a second direction, and wherein the at least two variable resistance memory cells share the extended well.

16. The variable resistance memory device as claimed in claim 14, wherein the second well is biased with a voltage lower than a ground voltage during an erase operation of the at least two variable resistance memory cells.

17. A memory system, comprising:
a variable resistance memory device; and
a controller configured to control the variable resistance memory device,
wherein the variable resistance memory device includes:
a memory array including at least one variable resistance memory cell;
a word line driver biasing at least one word line connected to the at least one variable resistance memory cell; and
a bit line driver and sense circuit biasing bit lines connected to the at least one variable resistance memory cell through at least one bit line and sensing a voltage of the at least one bit line,
wherein each variable resistance memory cell includes:
a well having a first type;
a second well having a second type different from the first type provided below the well; and
a cell structure on the well, the cell structure including a structure having the second type and a variable resistance layer on the structure,
wherein at least two variable resistance memory cells are provided on the second well, and the second well is floated during a program or read operation of the at least two variable resistance memory cells.

18. The memory system as claimed in claim 17, wherein the variable resistance memory device and the controller forms a solid state drive (SSD).

* * * * *